(12) United States Patent
Kobayashi et al.

(10) Patent No.: US 7,064,645 B2
(45) Date of Patent: Jun. 20, 2006

(54) ELECTRONIC DEVICE

(75) Inventors: Kazuhiko Kobayashi, Kawasaki (JP); Hideharu Sakoda, Kawasaki (JP); Hirohisa Matsuki, Kawasaki (JP); Osamu Igawa, Kawasaki (JP); Mitsutaka Sato, Kawasaki (JP); Koju Aoki, Kasugai (JP); Hiroyuki Sakima, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/318,377

(22) Filed: Dec. 13, 2002

(65) Prior Publication Data
US 2003/0127704 A1   Jul. 10, 2003

(30) Foreign Application Priority Data

Dec. 14, 2001 (JP) ............................ 2001-381325
Oct. 22, 2002 (JP) ............................ 2002-307429

(51) Int. Cl.
*H01F 5/00* (2006.01)
(52) U.S. Cl. ..................................... 336/200
(58) Field of Classification Search .............. 336/65, 336/83, 192, 200, 206–208, 232
See application file for complete search history.

(56) References Cited

U.S. PATENT DOCUMENTS

| | | | | | |
|---|---|---|---|---|---|
| 5,805,043 | A | * | 9/1998 | Bahl | 336/200 |
| 6,002,161 | A | * | 12/1999 | Yamazaki | 257/531 |
| 6,287,931 | B1 | * | 9/2001 | Chen | 438/381 |
| 6,356,183 | B1 | * | 3/2002 | Jou | 336/200 |
| 6,456,183 | B1 | * | 9/2002 | Basteres et al. | 336/200 |
| 6,477,031 | B1 | * | 11/2002 | Hayashi | 361/306.3 |
| 6,518,141 | B1 | * | 2/2003 | Lee et al. | 438/381 |
| 6,608,361 | B1 | * | 8/2003 | Chang et al. | 257/499 |
| 6,784,518 | B1 | | 8/2004 | Merckel et al. | |

FOREIGN PATENT DOCUMENTS

| | | |
|---|---|---|
| EP | 1 047 132 A1 | 10/2000 |
| JP | 10-289966 | 10/1998 |
| JP | 2000-235979 | 8/2000 |

* cited by examiner

*Primary Examiner*—Tuyen T Nguyen
(74) *Attorney, Agent, or Firm*—Westerman, Hattori, Daniels & Adrian, LLP

(57) ABSTRACT

The present invention realizes a miniaturized electronic device that is still capable of maintaining its high reliability even when miniaturized. To this end, the electronic device has an electronic circuit, comprising: a substrate with a circuit formation surface on which one part of the electronic circuit is formed; a polyimide layer that is formed on the circuit formation surface; and a spiral inductor constituting another part of the electronic circuit, which is formed into a pattern on the polyimide layer.

10 Claims, 21 Drawing Sheets

ELECTRONIC DEVICE

BACKGROUND OF THE INVENTION

1. Field of the Invention

The present invention generally relates to an electronic device, and particularly to a miniaturized electronic device typically represented by a semiconductor device having a chip size package structure.

2. Description of the Related Art

In recent years, the miniaturization and slimming of mobile communication apparatuses, as represented by the mobile phone, have been advancing with astonishing speed. With this advancement comes the demand for the miniaturization of the electronic device; namely, the electronic components and semiconductors implemented in these electronic apparatuses.

For example, with the reduction in size and weight of mobile communication apparatuses using high frequency bandwidths such as the mobile phone, there is a great demand for miniaturization and high-density circuit design of the electronic devices implemented in these mobile communication apparatuses. These electronic devices are basically composed of a high frequency active component and a passive circuit. Thus, to realize the miniaturization of the electronic circuit, a high-scale integration of the high frequency (RF) active component and the high frequency (RF) passive circuit is being contemplated.

However, in an attempt to integrate the matching circuit for a high frequency active component such as a power amp (PA) or a low noise amp (LNA), it will be impossible to avoid characteristics degradation due to the loss of the passive circuit. Thus, in the conventional art, the matching circuit of the component that influences the characteristic is not integrated; instead it is matched externally. Also, as for the PA and the like, it is not realistic from the point of view of costs to implement a matching circuit or a power circuit onto the semiconductor substrate, with regard to its electronic current capacity.

However, the demand for the miniaturization and reduction in components of the above-described high frequency components implemented in the mobile communication apparatus such as the mobile phone is becoming ever so greater, and in recent years, there is also a rising demand for the integration of these matching circuits. Thus, in order to meet these demands, various propositions are being made concerning RF passive circuits (spiral inductors in particular) formed on the semiconductor substrate, and although some improvements can be seen, problems regarding the Q value and the like still remain and a fundamental solution to the problem has not yet been found.

SUMMARY OF THE INVENTION

With regard to the above-mentioned problems, the object of the present invention is to provide a highly reliable electronic device whose characteristics are not degraded even upon its miniaturization.

The present invention is characterized in that it resorts to each of the following measures in order to achieve the above object.

The present invention according one aspect is:

an electronic device having an electronic circuit and an external connection terminal that is connected to the above electronic circuit, comprising:

a substrate having a circuit formation surface on which one portion of the electronic circuit is formed;

an insulating layer formed on the above circuit formation surface; and, internal wiring that includes wiring for connecting the electronic circuit to the external connection terminal and another portion of the electronic circuit that is formed into a pattern in the insulating layer or on said insulating layer.

According to the present invention, it is possible to implement a passive circuit and the like within an insulating layer formed on the substrate of the electronic circuit, rather than implementing it outside as in the conventional art. Thus, the electronic device may have multiple functions and an electronic apparatus implementing such electronic device may be able to reduce its size and number of components.

Also, in the present invention, the electronic circuit formed by the internal wiring can be an inductor, in particular, a spiral inductor. Further, the above electronic device may have multiple layers of the spiral inductor. Alternatively, the electronic circuit formed by the internal wiring may comprise an antenna, or both an inductor and an antenna.

Further, the above electronic device comprising the inductor and the antenna may be formed into layers, wherein the position of the antenna is located further away from the circuit formation surface compared to the position of the inductor.

Alternatively, in the present invention, the antenna can be placed on the side of the substrate opposite from the circuit formation surface.

Also, the connecting position of the electronic circuit composed of the internal wiring to the electronic circuit formed on the circuit formation surface of the substrate may be at the inner end of the internal wiring.

Additionally, the above electronic device may comprise a shield layer in between the electronic circuit formed by the internal wiring and the electronic circuit formed on the substrate. Further, the above shield layer may have a mesh structure.

Also, the above electronic device may have an isolating layer for electrically separating said substrate from said electronic circuit formed by the internal wiring implemented on the substrate. Further, the isolation layer may be made of an insulating material that is filled into a microscopic trench formed on the substrate.

In the present invention a low noise amp or a power amp may be used as the electronic circuit.

Additionally, the present invention according to another aspect proposes an electronic device comprising:

a substrate on which an electronic circuit as well as an inorganic insulating layer are formed;

a first insulating film formed on the inorganic insulating layer;

an inductor structured by wiring that is formed on the first insulating film; and, a second insulating film formed on the first insulating film so as to cover said inductor; wherein, the first insulating film has a thickness of no less than 9 μm; and, the second insulating film has a thickness of no less than 55 μm.

According to the above invention, the parasitic capacitance and the parasitic resistance can be prevented from being generated in between the substrate and the inductor and in between the exterior device/apparatus and the inductor. This in turn enables an increase in the Q value of the inductor.

In the above invention, the first insulating film of the electronic device is made of polyimide or organic insulating material with epoxy as its main component. Additionally, the second insulating film of the electronic device may be made of epoxy or organic insulating material with epoxy as its main component.

The above first insulating film may have a single layer structure or it may have a multi-layer structure. In the latter case, the first insulating film may comprise a plurality of insulating layers that are made of different organic insulating materials.

Further, in the electronic device comprising the first insulating film having a multi-layer structure formed by a plurality of insulating layers and an inter-layer wiring for connecting an electrode formed on the substrate and the inductor, the insulating layers forming the first insulating film may each have holes that have different diameters, the insulating layer positioned higher from the substrate having the smaller diameter, and at least the uppermost insulating layer may be arranged to cover said inorganic insulating layer.

Additionally, in the electronic device comprising the inter-layer wiring for connecting an electrode formed on the substrate and the inductor, the diameter of the hole for implementing the inter-layer wiring formed at the first insulating film may be arranged to be smaller than the diameter of the hole formed at the inorganic insulating layer, and the first insulating film may cover the inorganic insulating layer.

Also, the electronic device of the present invention may have a wiring post for connecting the wiring to an external connection terminal so that the thickness of the second insulating film is restricted by the height of the above wiring post.

DESCRIPTION OF THE PREFERRED EMBODIMENTS

In the following, a description of the preferred embodiments of the present invention is given with reference to the accompanying drawings.

First, a description of an electronic device according to the first embodiment of the present invention will be given. In the following description, a semiconductor device is represented as an example of the electronic device of the present invention.

Figure 1:
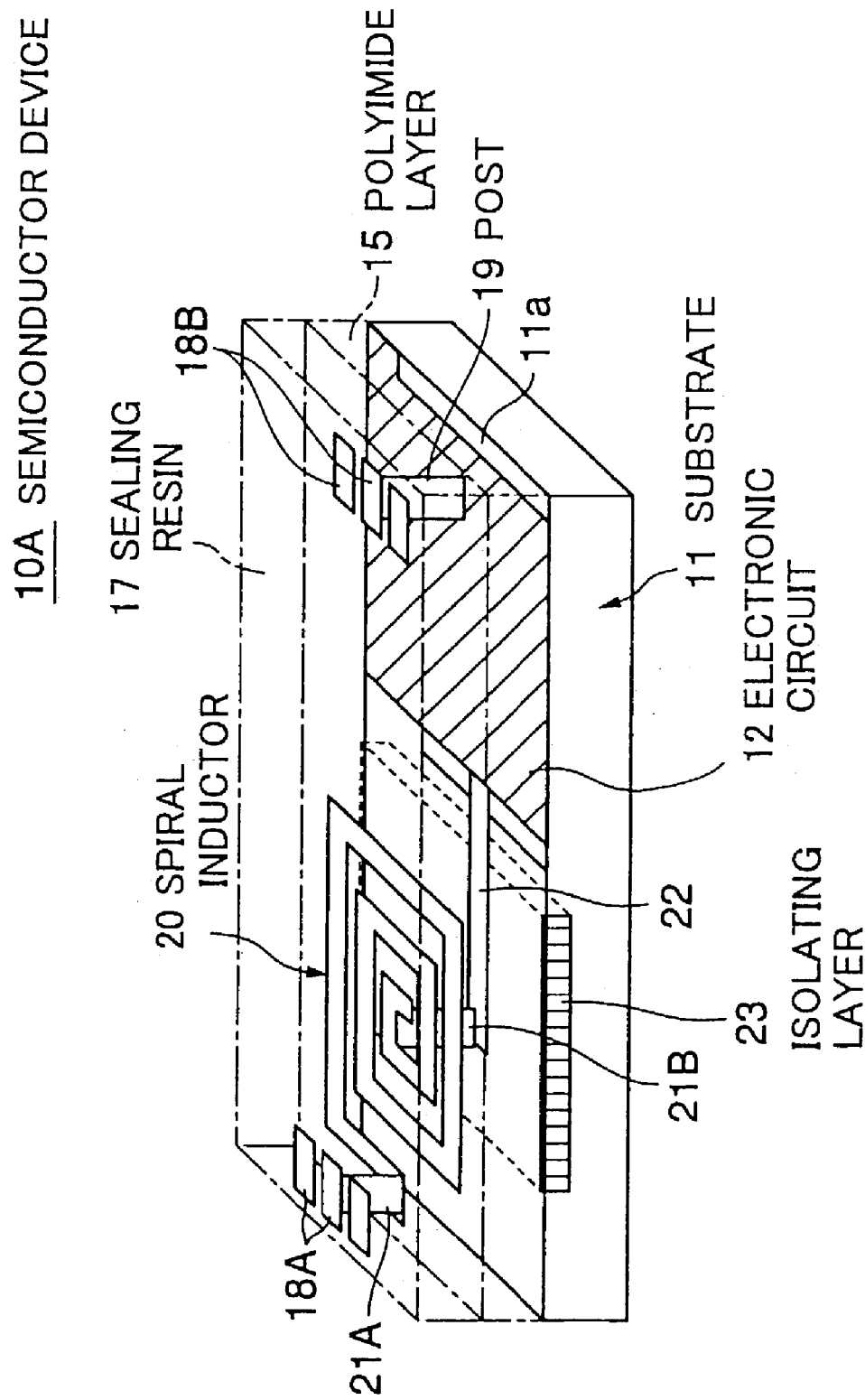
FIG. 1 is a schematic drawing of an electronic device according to a first embodiment of the present invention.
Figure 2A:
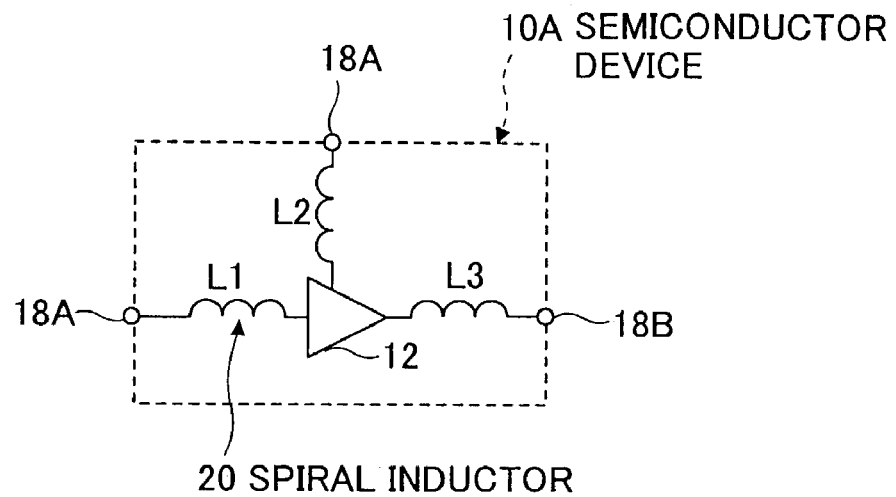
FIG. 2 is an equivalent circuit diagram of the electronic device according to the first embodiment of the present invention.
Figure 2B:
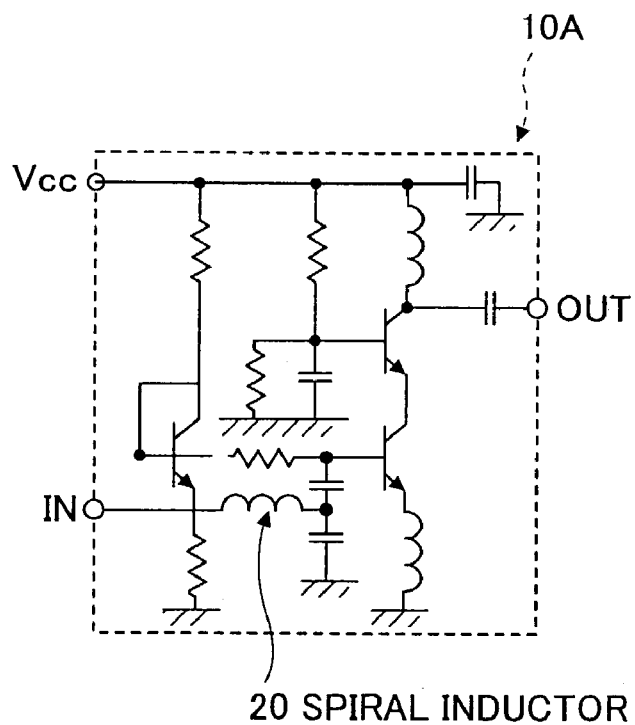
Figure 3:
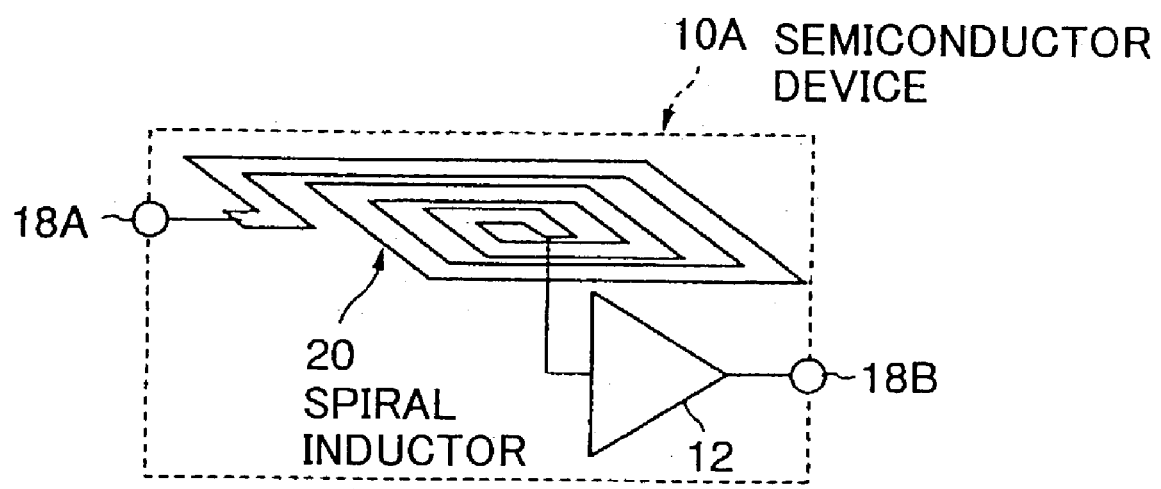
FIG. 3 is an equivalent circuit diagram illustrating the connection of a spiral inductor to an electronic circuit.
Figure 4:
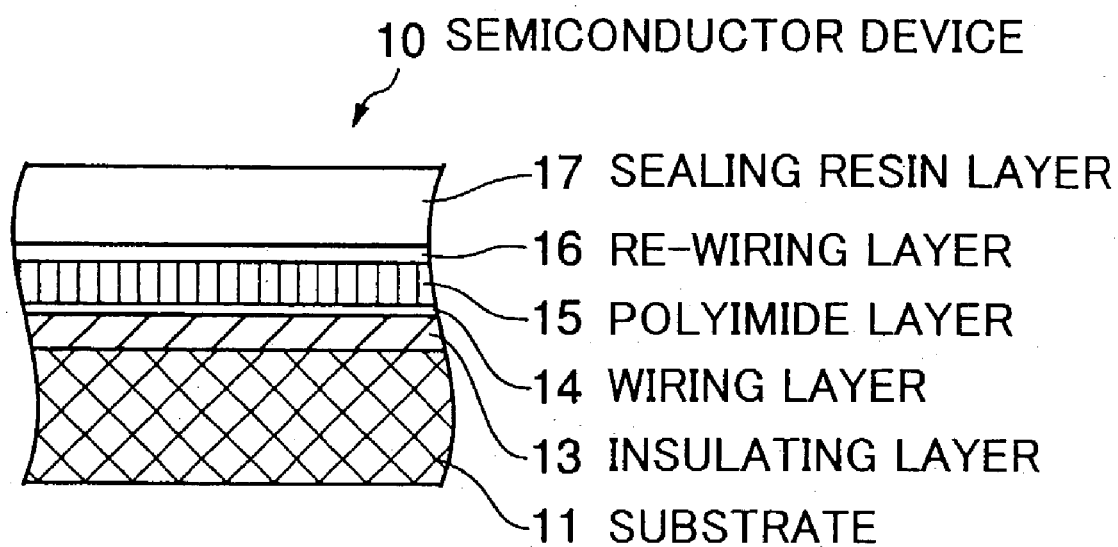
FIG. 4 is a cross sectional view of the semiconductor device of the first embodiment of the present invention.

FIGS. 1 through 4 describe a semiconductor device 10A according to the first embodiment of the present invention. FIG. 1 is a schematic drawing of the semiconductor device 10A; FIGS. 2 and 3 are circuit diagrams of the semiconductor device 10A; and FIG. 4 is a cross sectional view of the semiconductor device 10A.

The semiconductor device 10A comprises a substrate 11, an electronic circuit 12, an insulating film layer 13, wiring layer 14, a polyimide layer 15, a re-wiring layer 16, a sealing resin layer 17, and a spiral inductor 20. This semiconductor device 10A has a CSP (Chip Size Package) structure. A CSP structure is a package structure having roughly the same outer dimensions as that of the semiconductor chip.

Substrate 11 is a silicon substrate (semiconductor substrate), and the electronic circuit 12 is formed on the circuit formation surface 11a which is the upper surface of said substrate. The electronic circuit 12 comprises a part of the electronic circuit implemented in the semiconductor device 10A and is formed using a well-known semiconductor fabrication technique.

Further, the electronic circuit 12 is a high frequency active circuit, and in particular, a low noise amp (referred to as LNA hereinafter) as shown in FIGS. 2A and 2B. In this embodiment, not all the inductors that comprise a matching circuit are formed on the spiral inductor 20; however, an inductor L1 that comprises the input matching circuit influencing the NF characteristics, the crucial characteristics of the LNA, is formed by the spiral inductor 20.

Also, an isolating layer 23 is formed at a position shifted from the position of the electronic circuit 12 on the circuit formation surface 11a. The isolating layer 23 comprises an insulating material (for example, $SiO_2$, etc) filled into a micro-fabricated trench. The isolating layer 23 functions as an isolator for electrically separating the subsequently-described spiral inductor 20 and the substrate 11.

On the above-described substrate 11, the insulating film layer 13, the wiring layer 14, the polyimide layer 15, the re-wiring layer 16, and the sealing resin layer 17 are successively formed, as indicated in FIG. 4, which is a cross-sectional view of the electronic circuit 12.

The insulating film layer 13 is a $SiO_2$ film which is directly formed on top of the silicon substrate. On the insulating film layer 13, the wiring layer 14 is formed. The wiring layer 14 comprises the wiring and the I/O terminals of electronic circuit 12.

The polyimide layer 15 has electrical isolation and is mounted on the substrate 11 with a thickness of 12 μm, for example. This polyimide layer 15 is formed using a spinner or the like, so that it is separated from the substrate 11, unlike the insulating film layer 13.

The re-wiring layer 16 corresponds to the internal wiring disclosed in the claims of the present invention and can be composed of copper (Cu), for example. It is formed on top of the polyimide layer 15 according to a predetermined pattern. As the for the formation technique of this re-wiring layer 16, various film formation techniques can be used such as plating, spattering and CVD. Further, the wiring pattern of the re-wiring layer 16 can easily be formed into any shape pattern by performing a well-known masking process or resistance process. For convenience's sake, the description of the re-wiring layer 16 is given later.

The sealing resin layer 17 is, for example, made of epoxy resin, and has electrical isolation like the previously-described polyimide layer 15. This sealing resin layer 17 is formed, for example, by using the compression formation technique. Input pads 18A and output pads 18B are formed at predetermined positions on this sealing resin layer 17.

External connection terminals not shown in the drawings (e.g. solder balls, etc.) are formed on each of the pads 18A and 18B. Also, each of the pads 18A and 18B are connected to the spiral inductor 20 via an outer post 21A. Further, the output pads 18B are connected to the electronic circuit 12 through the use of a post 19.

In the follwoing, a description of the present embodiment with an emphasis on the spiral inductor 20 is given.

Figure 12:
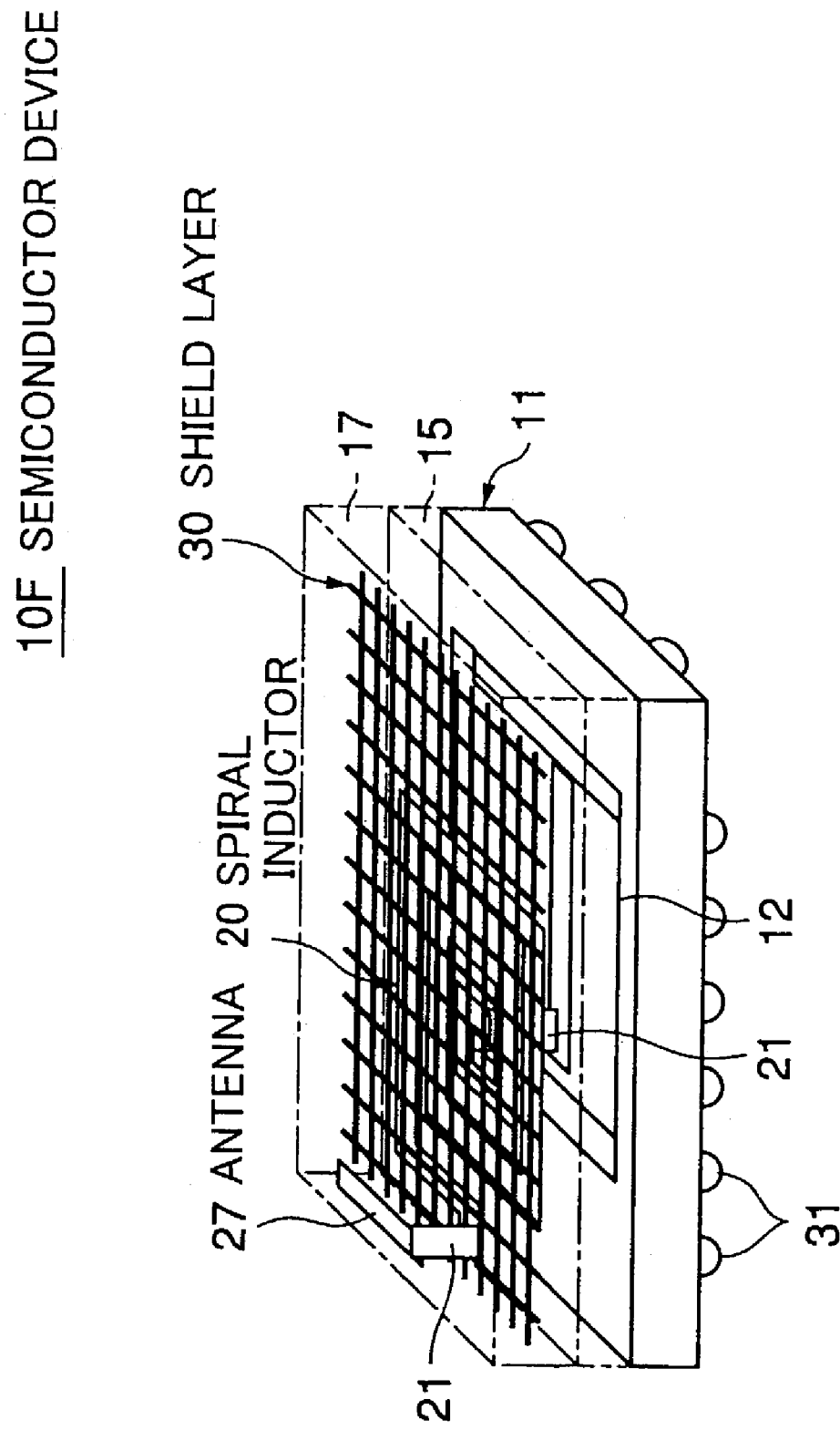
FIG. 12 is a schematic drawing of an electronic device according to a sixth embodiment of the present invention; and, FIG. 13 shows the transmission characteristics of the electronic device according to the sixth embodiment of the present invention.

The previously-mentioned re-wiring layer 16 basically functions as the wiring extending the I/O terminals of the electronic circuit 12 to the positions of the external connection terminals 31 (refer to FIG. 12; not shown in FIG. 1). However, in the embodiment of the present invention, the re-wiring layer 16, which is originally formed as the wiring for connecting the I/O terminals of the electronic circuit 12 to the external connection terminals 31, also comprises the spiral inductor 20 formed into a spiral-shaped wiring pattern. Thus, the semiconductor device 10A according to this embodiment is characterized in that it forms an inductor; namely, the spiral inductor 20, at a position separated from the position of the electronic circuit 12, which is formed on the substrate 11.

The spiral inductor 20 is a passive circuit and constitutes another part of the electronic circuit mounted on the semiconductor device 10A. Thus, the electronic circuit 12 (high frequency active circuit) formed on the circuit formation surface 11a of the substrate 11, and the spiral inductor 20 (high frequency passive circuit) formed as the re-wiring layer 16 on top of the polyimide layer 15 co-operate to constitute the electronic circuit of the semiconductor device 10A.

One end of the spiral inductor 20 is connected to the input pads 18A via the outer post 21A. Also, the other end of the spiral inductor 20 is connected to the electronic circuit 12 via wiring 22. Further, the spiral inductor 20 (the re-wiring layer 16) can be fabricated at a low cost since it can be formed using a well-known film formation technique as described above.

As previously described, the semiconductor device 10A according to this embodiment has a spiral inductor 20 that is separated from the inductors L2 and L3 (not shown in FIG. 3) formed in the electronic circuit 12. Also, the spiral inductor 20 is formed inside the semiconductor device 10A.

Thus, in the present embodiment, the spiral inductor 20 (passive circuit), which is implemented outside in the conventional art, is formed at the inner side of the insulating layer that is composed of the polyimide layer 15 and the sealing resin layer 17, both formed on the substrate 11. This allows the semiconductor device 10A to have multiple functions, and also realizes the miniaturization and reduction in the number of components of the semiconductor device 10A that implements the spiral inductor 20.

As mentioned previously, the re-wiring layer 16 comprising the spiral inductor 20 is made of copper (Cu), and the thickness of the polyimide layer 15 is a few dozen microns. Hence, the loss due to the resistance of the re-wiring layer 16 and the influence from the coupling of the upper and lower layers of the multi-layered structure can be reduced.

However, as also mentioned earlier, the basic function of the re-wiring layer 16 is to extend the I/O terminals of the electronic circuit 12 to the outer connection terminals 31. Even when forming the re-wiring layer 16 so as to perform its original functions, there will still be a certain degree of flexibility in the wiring between the polyimide layer 15 and the sealing resin layer 17 constituting the insulating layer.

Thus, composing the spiral inductor 20 in the re-wiring layer 16 allows more flexibility in setting the inductance value, compared to implementing it on the substrate 11 comprising the electronic circuit 12. Also, the shape of the spiral inductor 20 and the connection mode of the electronic circuit 12 have a certain degree of flexibility.

For example, in the case of an LNA, its most important characteristics being the NF characteristics, the spiral inductor 20 is implemented as the inductor corresponding to the input matching circuit. In the case of the PA, the spiral inductor 20 is implemented as the output matching circuit and the power circuit with regard to the electric current capacity. Thus, the spiral inductor 20 can easily be adapted to a structure in accordance with the circuit characteristic of the electronic circuit 12.

In the following, an emphasis is put on the previously-described isolating layer 23. As shown in FIG. 1, the isolating layer 23 is formed right below the spiral inductor 20. This isolating layer 23 comprises an insulating material that is filled into a microscopic trench formed on the substrate 11, and performs the function of electrically separating the substrate 11 from the spiral inductor 20.

In such a structure, since the substrate 11 and the spiral inductor 20 are electrically separated by the isolating layer 23, the degradation of the Q value from the influence of the substrate 11 can be prevented, and the reliability of the electronic device can be improved further. In particular, when a silicon substrate is used as the substrate 11 as in the present embodiment, the degradation of the Q value will be apparent without the isolating layer 23; however, by implementing this isolating layer 23, the degradation of the Q value can be effectively prevented.

Also, as mentioned above, there is a polyimide layer in between the substrate 11 and the spiral inductor 20. The polyimide resin constituting the polyimide layer 15 has high electric isolation and a low dielectric constant (relative dielectric constant). Thus, even without implementing the isolating layer 23, the degradation of the Q value can be prevented by the polyimide layer 15, and an electronic component may possibly be arranged right below the spiral inductor 20. Therefore, by implementing the isolating layer as in the above-described embodiment, the degradation of the Q value can be further prevented.

Here, although an insulating material filled into a microscopic trench has been used as the isolating layer 23 in the above embodiment, a conductive layer ($N^+$ layer) may be formed as the ground potential right below the spiral inductor 20 in an alternative embodiment, and the same effects can be obtained.

Also, note that although in the above embodiment, a spiral inductor 20 has been introduced as the inductor in the semiconductor device 10A, it is possible to change the shape of the inductor from a spiral shape to another shape. However, a spiral shape would be the most effective since it can realize a high inductance value in a very small area.

Also note that although in the above embodiment, the inductors L1 and L2 are formed on the substrate 11, as shown in FIG. 2, these inductors L1 and L2 may be formed on the re-wiring layer 16 so that the entire passive circuit is formed on the re-wiring layer 16.

Next, a description of the second embodiment of the present invention is given.

Figure 5:
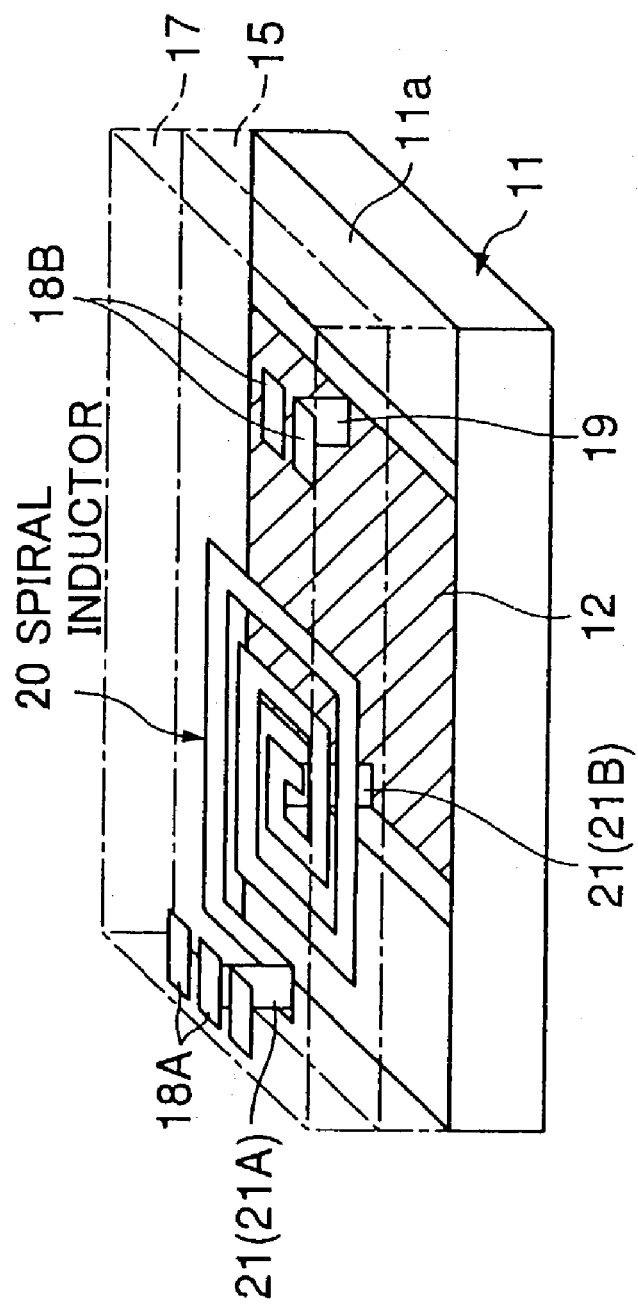
FIG. 5 is a schematic drawing of an electronic device according to a second embodiment of the present invention.

FIG. 5 shows a semiconductor device 10B according to the second embodiment of the present invention. In this drawing, the components that are identical to those described in the previously-described FIGS. 1 through 4 are given the same numerical notations, and their descriptions are omitted. The same also applies to the upcoming description of the third embodiment of the present invention.

The semiconductor device 10A according to the first embodiment of the present invention is arranged such that the positions of the electronic circuit 12 and the spiral inductor 20 are shifted away from each other on the circuit formation surface 11a. In other words, according to the first embodiment of the present invention, the electronic circuit 12 and the spiral inductor 20 of the semiconductor device 10A do not face each other.

On the contrary, the semiconductor device 10B according to the second embodiment of the present invention is arranged such that the electronic circuit 12 and the spiral inductor 20 are faced opposing each other. Also, the electronic circuit 12 of this embodiment is an LNA.

By implementing the electronic circuit directly below the spiral inductor 20, as in the present embodiment, the wiring for connecting the electronic circuit 12 and the spiral inductor 20, and the Q value degradation of the inductor by the post 21 can be reduced. Also, since the electronic circuit 12 and the spiral inductor 20 form a layer, the area of the chip viewed from the top side of the semiconductor device 10B can be reduced, thus enabling the miniaturization of the semiconductor device.

Also, as mentioned earlier, since the electronic circuit 12 is an LNA in the present embodiment, the degradation of the NF value caused by the integration of an input matching circuit can be reduced, thus enabling the semiconductor device 10B to function as a super-miniaturized LNA that does not require an external input matching circuit.

Further, since the electronic circuit 12 is implemented directly below the spiral inductor 20 in the present embodiment, the post 21 that electrically connects the electronic circuit 12 and the spiral inductor 20 is positioned at the inner end of the spiral inductor 20 (the post 21 connecting the inner end to the electronic circuit 12 will be referred to as the inner post 21B hereinafter).

The inner post 21B can be shortened by the above-described structure. Thus, the characteristic degradation caused by the inner post 21B can be reduced and the influence from oscillation can also be controlled.

Now, a description of the third embodiment of the present invention is given.

Figure 6:
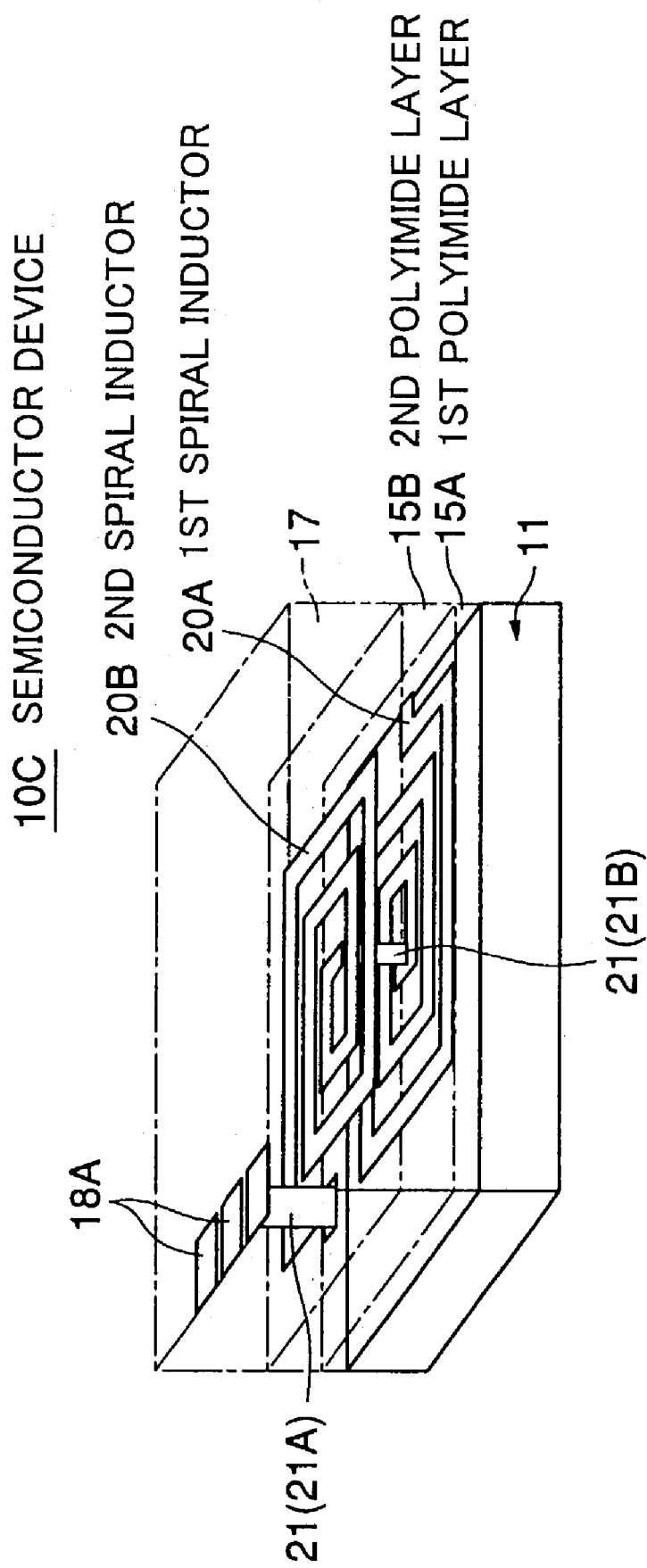
FIG. 6 is a schematic drawing of an electronic device according to a third embodiment of the present invention.
Figure 7A:
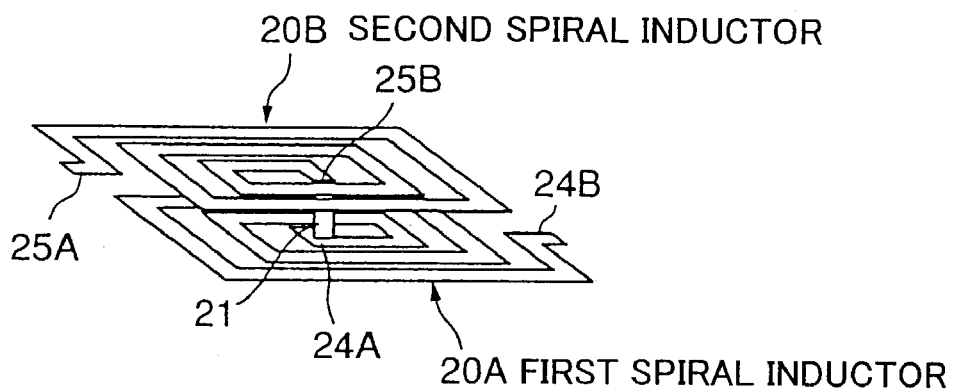
FIG. 7 is a perspective view of spiral inductors forming a two-layer structure.

FIGS. 6 and 7 show a semiconductor device 10C according to the third embodiment of the present invention. The semiconductor device 10C of the present embodiment comprises a plurality of spiral inductors (two in this example), 20A and 20B.

The first spiral inductor 20A is formed into a pattern on a first polyimide layer 15A which is formed on the substrate 11. The second spiral inductor 20B is formed into a pattern on a second polyimide layer 15B which is formed on top of the first polyimide layer 15A. Here, the second spiral inductor 20B is layered on top of the first spiral inductor 20A when viewed from the top of the semiconductor device 10C.

In the above structure, the inductors of the semiconductor device are composed of the first and second spiral inductors 20A and 20B, so that the inductance value can be raised higher. Also, as shown in the enlarged drawing of FIG. 7, the first and second spiral inductors 20A and 20B are piled up in layers, thus reducing the top view area of the semiconductor device 10C. In this way, the semiconductor device 10C according to the present invention is able to realize a high inductance value in a small area.

As in the second embodiment, this embodiment also enables the prevention of characteristics degradation caused by the inner post 21B and a reduction of the influence from oscillation, owing to the fact that the inner post 21B electrically connects the electronic circuit 12 and the spiral inductor 20 at the inner end of the spiral inductor 20, thus realizing a shorter inner post 21B.

Figure 7B:
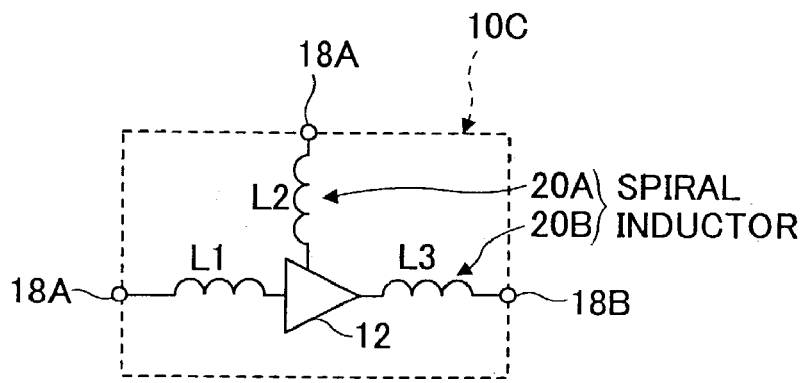
Figure 7C:
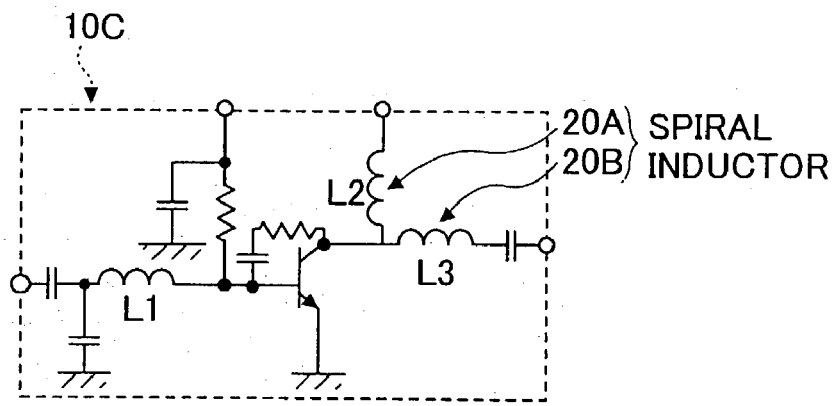

The electronic circuit 12 of the above semiconductor device 10C provided with first and second spiral inductors 20A and 20B may be a power amp as shown in FIGS. 7B and 7C. When the electronic circuit 12 includes a power amp, not all the inductors L1–L3 that comprise a matching circuit are formed at the spiral inductor 20 (re-wiring layer 16); rather, inductor L3 that comprises the output matching circuit influencing the output characteristics, the crucial characteristics of the power amp, is arranged to be the spiral inductor 20B. Further, in the example shown in FIG. 7C, a choke coil L2 is used as the spiral inductor 20A in the supply circuit, the inductor L1 that comprises the input matching circuit is formed through a semiconductor fabrication process, wherein all the inductors L1–L3 that comprise the matching circuit are integrated.

Figure 8:
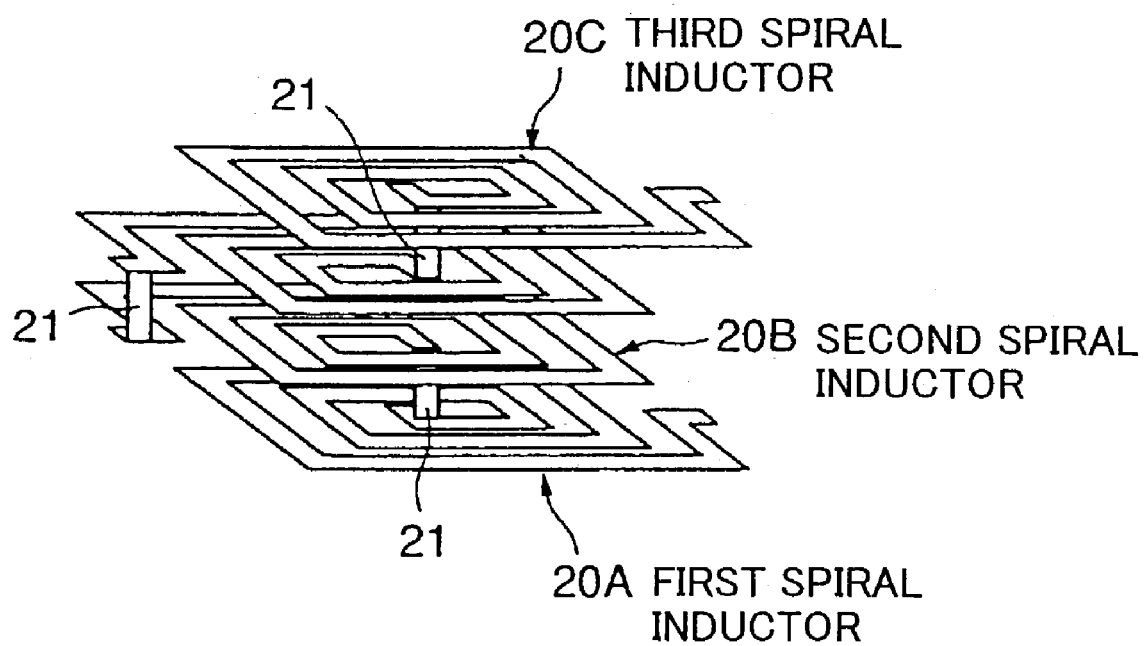
FIG. 8 is a perspective view of spiral inductors forming a three-layer structure.

Here, the spiral inductors are not limited to two layers but may be in three layers as shown in FIG. 8 (provided with first through third spiral inductors 20A, 20B, and 20C) or in four or more layers as well. Thus, the inductance value may also be established by selecting the number of layers of spiral inductors.

Figure 14A:
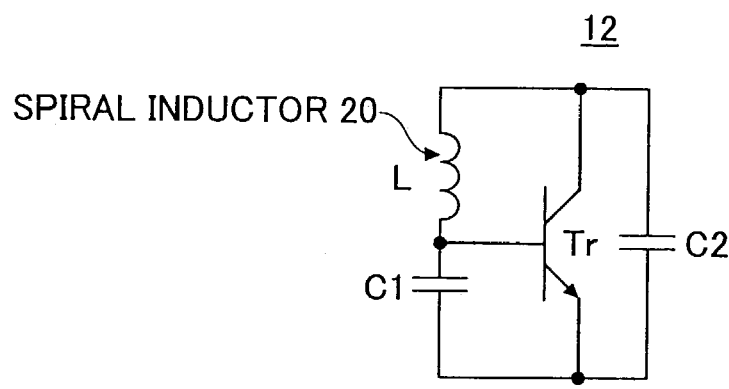
FIGS. 14A and 14B are circuit diagrams illustrating exemplary implementations of the spiral inductor.
Figure 14B:
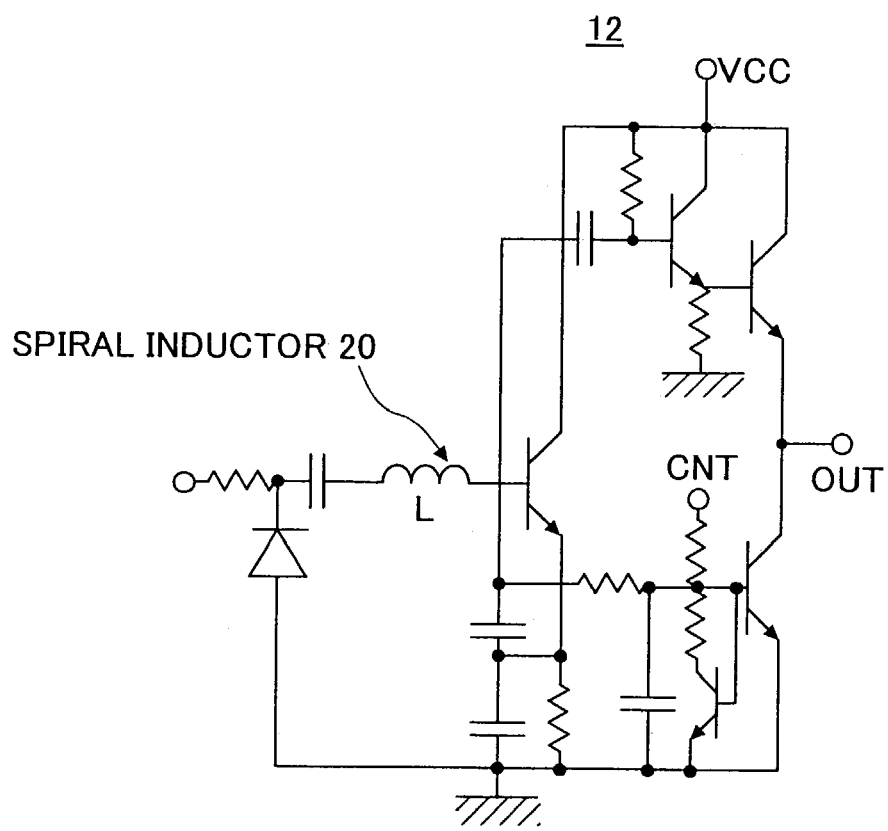

Also, when the electronic circuit 12 in the semiconductor device includes a dial circuit as shown in FIG. 14, the spiral inductor is implemented as a resonance circuit (inductor L) which influences the phase noise characteristics of the dial circuit.

In the following, a description of the fourth embodiment of the present invention is given.

Figure 9:
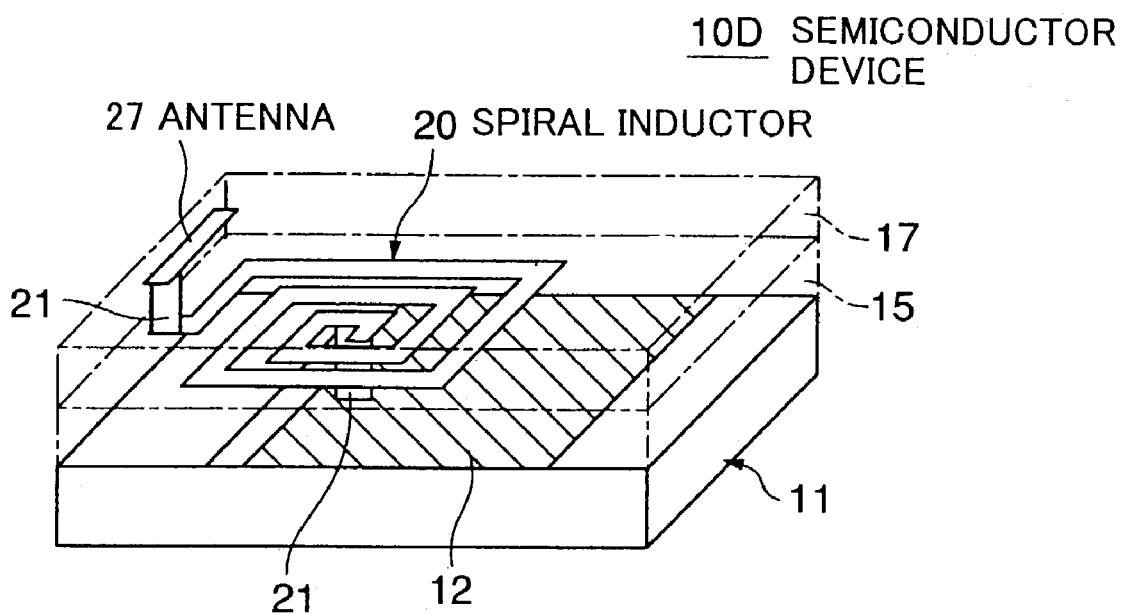
FIG. 9 is a schematic drawing of an electronic device according to a fourth embodiment of the present invention.
Figure 10:
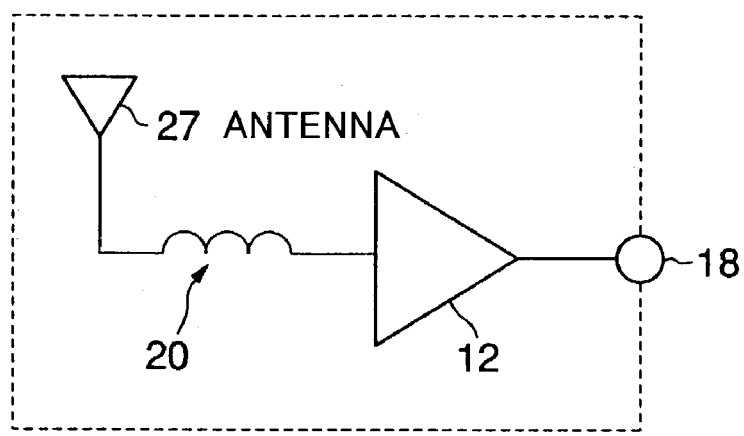
FIG. 10 is an equivalent circuit diagram illustrating the connection of an antenna and a spiral inductor to an electronic circuit.

FIGS. 9 and 10 show a semiconductor device 10D according to the fourth embodiment of the present invention. FIG. 9 is a schematic view of the semiconductor device 10D and FIG. 10 is an equivalent circuit diagram of the semiconductor device 10D.

The semiconductor device according to the fourth embodiment of the present invention is characterized by comprising an antenna 27. Also, the electronic circuit 12 is an LNA, and the electronic circuit 12 and the antenna 27 are connected via the spiral inductor 20 which is the input matching circuit. Thus, the semiconductor device 10D comprises an all-in-one receiver chip.

Also, it is possible to make the electronic circuit a PA. In such case, the antenna 27 is connected to the output port of the electronic circuit 12, thus reducing the loss caused by the wiring in between the electronic circuit 12 and the antenna 27, and thereby controlling the electric power consumption of the electronic circuit 12 as a PA.

Further, by implementing a component element of the transmitter/receiver device (e.g. PA, LNA, digital signal processing system, etc.) on the substrate 11, a super-miniaturized transceiver may be realized with little characteristic degradation from the loss of the wiring and the like. In such case, a resin material that would not disrupt the characteristic of the antenna 27 must be selected for the sealing resin layer 17.

As described above, in the present embodiment, the antenna 27 is implemented on the upper surface of the sealing resin layer 17 along with each of the pads 18A and 18B. However, the antenna 27 may be implemented on the polyimide layer 15, thereby forming a combined structure with the re-wiring layer 16. In such case, if the spiral inductor 20 is also formed on the polyimide layer 15, the spiral inductor 20 and the antenna 27 may be implemented as one combined structure.

In the semiconductor device 10D according to the present embodiment, the antenna is implemented so as to form a so-called one chip receiver device, thus realizing a highly reliable miniaturized transmitter, receiver, or transmitter/receiver device with little characteristic degradation influenced by such factors as the wiring. Also, since the antenna 27 and the spiral inductor 20 are implemented together in the semiconductor device 10D, the miniaturization of said device can be realized.

As for the positioning of the spiral inductor 20 and the antenna 27, the antenna 27 is positioned further away from the circuit formation surface 11a compared to the spiral inductor 20. In other words, the spiral inductor is embedded into the device, whereas the antenna 27 is exposed on the surface of the device (the antenna may be slightly embedded in the device as well). This structure can prevent the spiral inductor 20 from influencing the transmission/reception process of the antenna 27 thereby enabling a high transmission/reception characteristic.

In the above description, the antenna 27 is formed at a position facing the circuit formation surface 11a of the substrate 11; however, the antenna 27 may also be positioned on the opposite side of the circuit formation surface 11a of the substrate 11.

Here, it is presumed that the antenna 27 and each of the pads 18A and 18B, formed on the sealing resin layer 17 which is an insulating layer, are all included in what is referred to as the 'internal wiring' in the following claims of the present invention along with the spiral inductor 20.

Now, a description of the fifth embodiment of the present invention is given.

Figure 11:
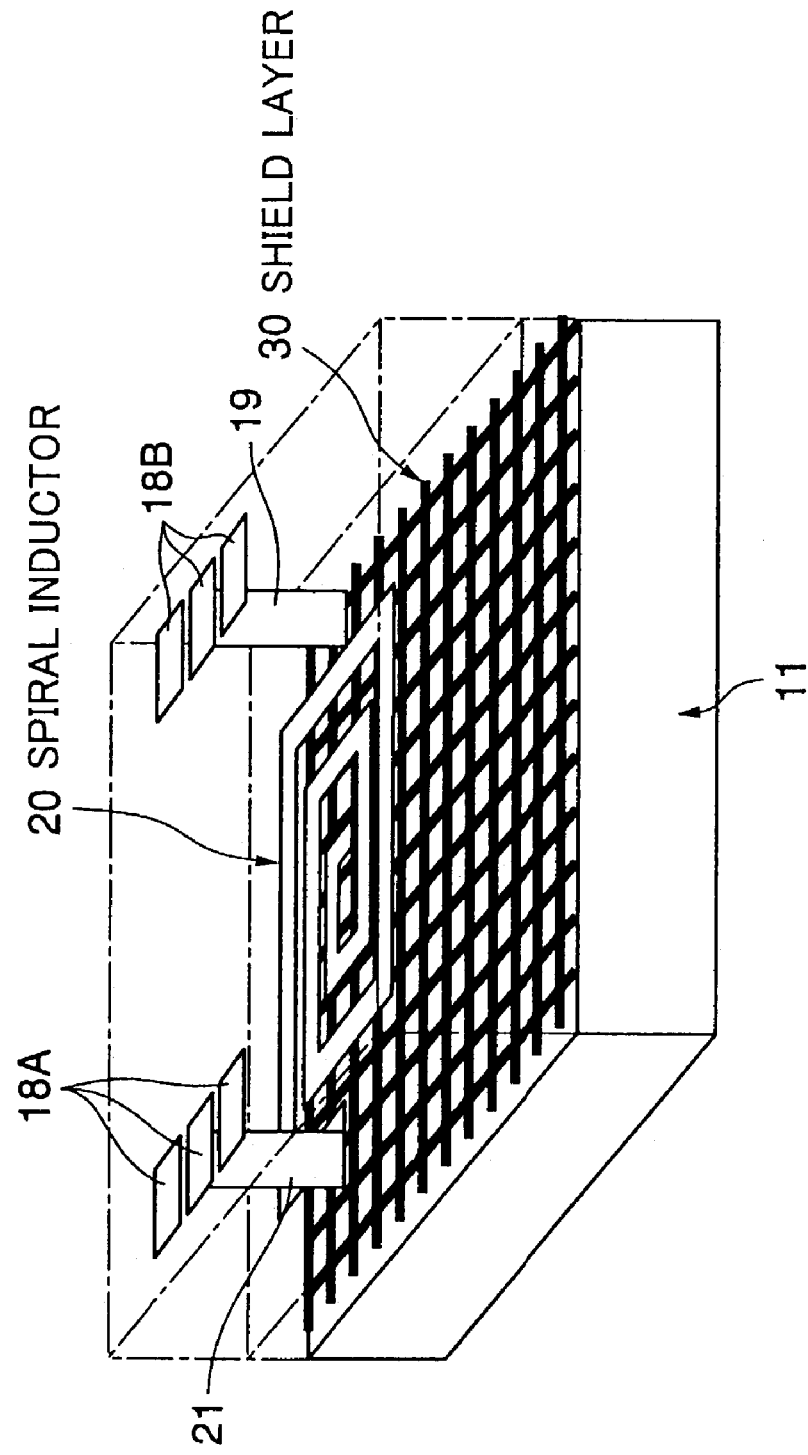
FIG. 11 is a schematic drawing of an electronic device according to a fifth embodiment of the present invention.

FIG. 11 shows a semiconductor device 10E according to the fifth embodiment of the present invention. The semiconductor device 10E of this embodiment is identical to the semiconductor 10B of the second embodiment shown in FIG. 5, except for the fact that in the semiconductor 10E, a shield layer 30 is formed in between the electronic circuit 12 and the spiral inductor 20.

This shield layer 30 is made of conductive metal, and is formed into a mesh structure. Also, this shield layer 30 is connected to grounded pads not shown in the drawing and is thus at ground potential.

By implementing the grounded shield layer 30 in between the electronic circuit 12 and the spiral inductor 20, as described above, the electronic circuit 12 and the spiral inductor 20 are electrically separated from each other (isolated) by the shield layer 30, thus preventing both sides from influencing each other. In this way, a highly reliable electronic circuit can be realized. Also, since the shield layer 30 has a mesh structure in the present embodiment, posts 19 and 21 can be implemented without isolating them from the shield 30, thereby simplifying the fabrication process of the posts 19 and 21.

In the following, a description of the sixth embodiment of the present invention is given.

FIG. 12 shows a semiconductor device 10F according to the sixth embodiment of the present invention. The semiconductor device 10F of the present embodiment is identical to the semiconductor device 10D of the fourth embodiment, except for the fact that in the semiconductor 10F, a shield layer 30 is formed in between the spiral inductor 20 and the antenna 27.

The above shield layer 30 is identical to that used in the semiconductor device 10E and is connected to grounded pads not shown in the drawing. Thus, this shield layer 30 is to be the ground potential. By implementing the grounded shield layer 30 in between the spiral inductor 20 and the antenna 27, as in the present embodiment, the spiral inductor 20 and the antenna 27 are electrically separated from each other (isolated) by the shield layer 30, thus preventing both sides from influencing each other. In this way, the antenna 27 can be prevented from picking up noise originating from the spiral inductor 20, and a highly reliable transmission/reception device can be realized.

Figure 13:
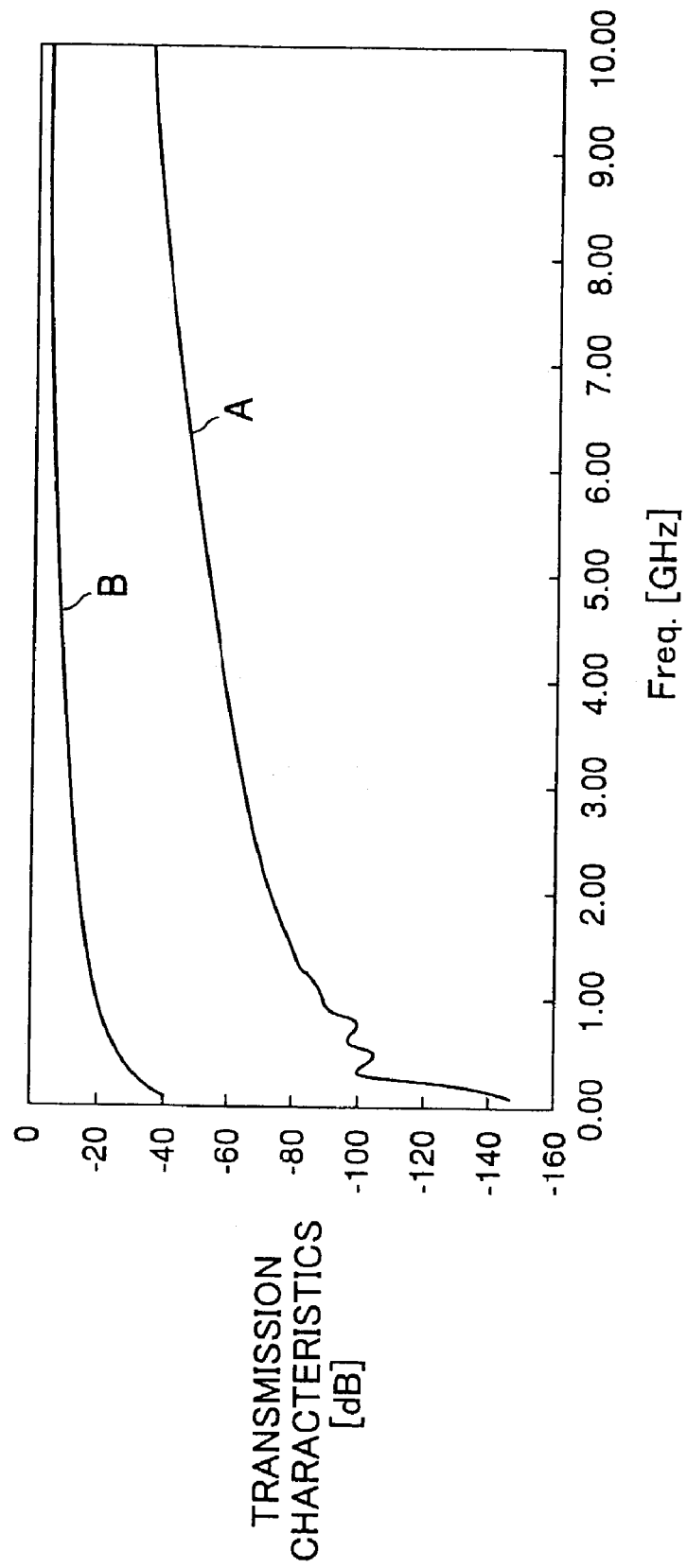

FIG. 13 shows the transmission characteristics of the semiconductor device 10F. In this graph, line A represents the characteristics of the semiconductor device 10F provided with the shield layer 30, and line B represents the characteristics of a semiconductor device without the shield layer 30. As is apparent from this graph, the semiconductor device 10F according to the present embodiment has better transmission characteristics.

In the above-described fifth and sixth embodiments, the shield layer 30 is implemented either in between the electronic circuit 12 and the spiral inductor 20, or in between the spiral inductor 20 and the antenna 27. However, this shield layer 30 can also be implemented in between the electronic circuit 12 and the spiral inductor 20, as well as in between the spiral inductor 20 and the antenna 27.

Next, a seventh embodiment of the present invention is described.

Figure 15:
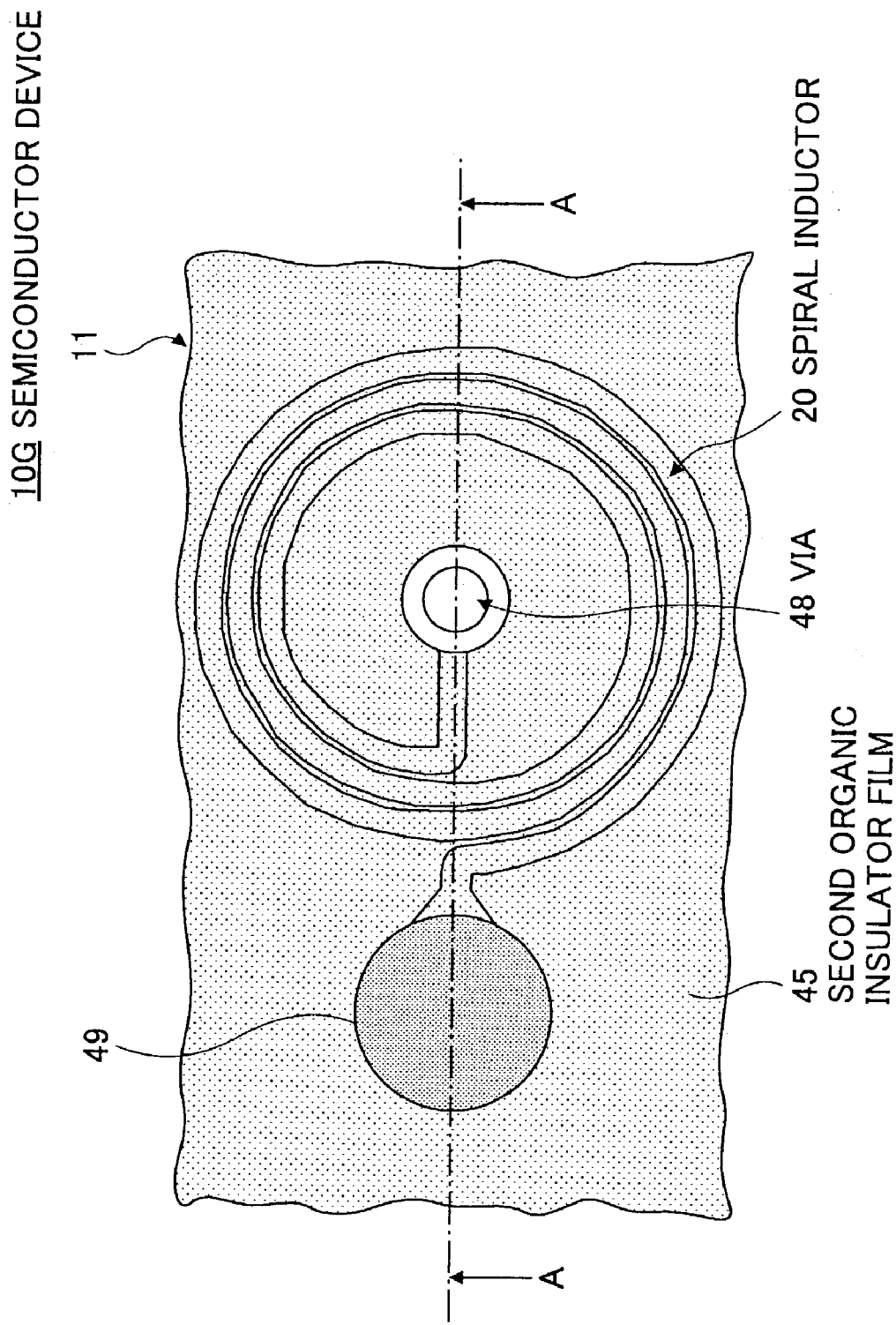
FIG. 15 is an enlarged top view of the essential components of the electronic device according to a seventh embodiment of the present invention.
Figure 16:
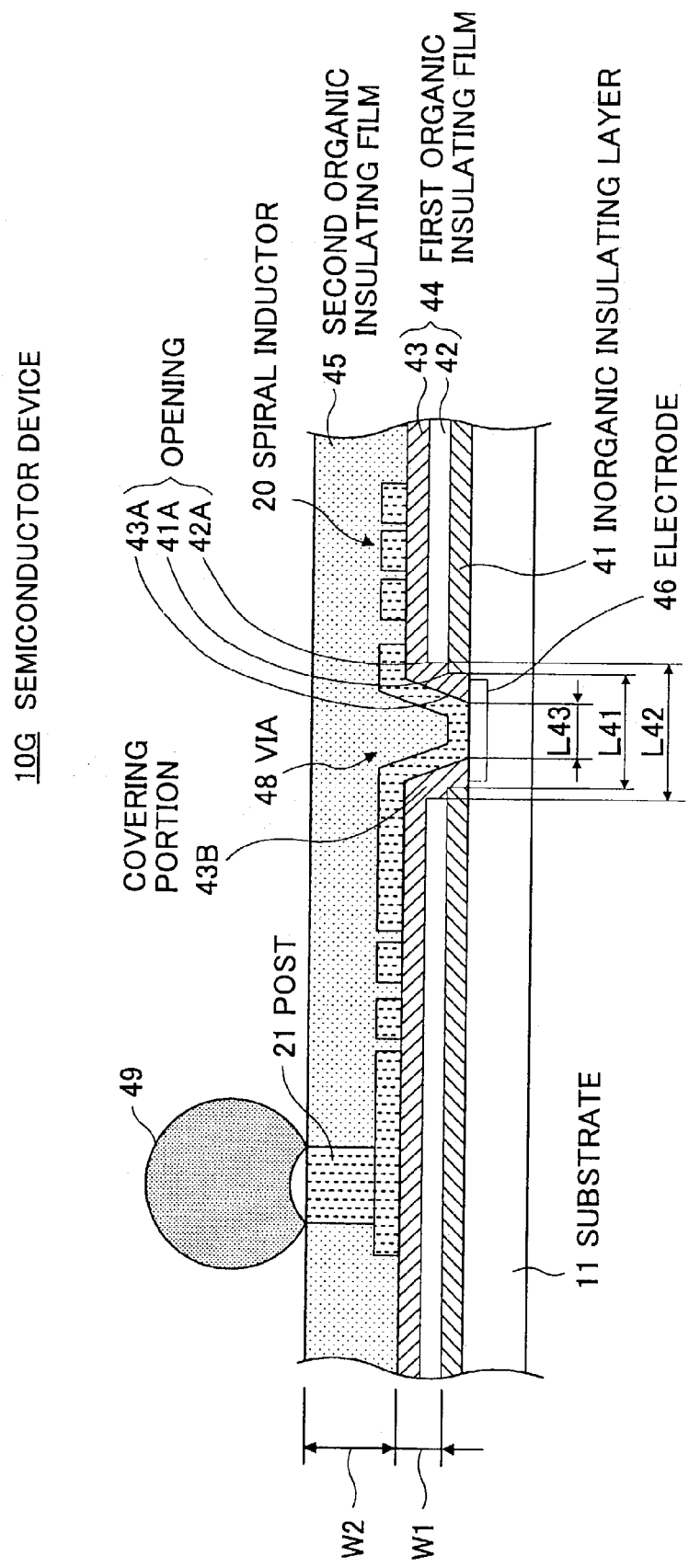
FIG. 16 is a cross sectional view of the electronic device illustrated in FIG. 15 cut along line A—A.

FIGS. 15 and 16 show a semiconductor device 10G according to the seventh embodiment of the present invention. FIG. 15 is an enlarged view of the region in which the spiral inductor 20 of the semiconductor device 10G is formed. FIG. 16 shows a cross sectional view of FIG. 15 cut across the A—A line.

The semiconductor device 10G according to this embodiment is characterized by a first organic insulating film 44 and a second organic insulating film 45 formed on the substrate 11. As shown in FIG. 16, the inorganic insulating layer 41, the first organic insulating film 44, and the second organic insulating film 45 are formed in layers on the substrate 11. Also, the spiral inductor 20 formed in the re-wiring layer 16 is mounted on the first organic insulating film 44.

The substrate 11 is a semiconductor substrate and on its circuit formation surface (the upper side of FIG. 16) the electronic circuit 12 (not shown) is formed. Also, an electrode 46 is formed at a predetermined position on the circuit formation surface of the substrate 11. The inner end of the spiral inductor 20 is electrically connected to the above electrode 46 by the via 48.

As for the outer end of the spiral inductor, a post 21 is formed thereon. The post 21 pierces through the second organic insulating film 45, which will be described in detail later on, and protrudes above this film layer. An external electrode 49 (solder ball) is formed on the above protruding portion of the post 21.

In the following, a description of each of the layers, from the inorganic insulating layer 41 to the second organic insulating film 45 formed on the substrate 11, is given. First, the inorganic insulating layer 41 is formed directly above the substrate 11. This inorganic insulating layer 41 functions as a passivation film, and may take the form of a PSG (phosphor silicate glass) film or a SiN film.

The first organic insulating film 44 is formed on top of the above inorganic insulating layer 41. This first organic insulating film 44 has a multi-layer structure comprising a first polyimide layer 42 and a second polyimide layer 43. As previously described, the spiral inductor 20 is formed into a pattern on this first organic insulating film 44.

Also, the second organic insulating film 45 is formed on the first organic insulating film 44. This second organic insulating film 45 has the same functions as those of the sealing resin layer 17, and may be made of epoxy or organic insulating material with epoxy as its main component, for example.

In this embodiment, the thickness of the first organic insulating film 44 (indicated by arrow W1 in FIG. 16) is set to no less than 9 µm, and the thickness of the second organic insulating film 45 (indicated by arrow W2 in FIG. 16) is set to no less than 55 µm. By establishing the above thickness of the first and second organic insulating films 44 and 45 to the above values, the Q value of the spiral inductor 20 can be raised. In the following, an explanation of why such an effect can be obtained is given with reference to FIGS. 17 and 18.

Figure 17:
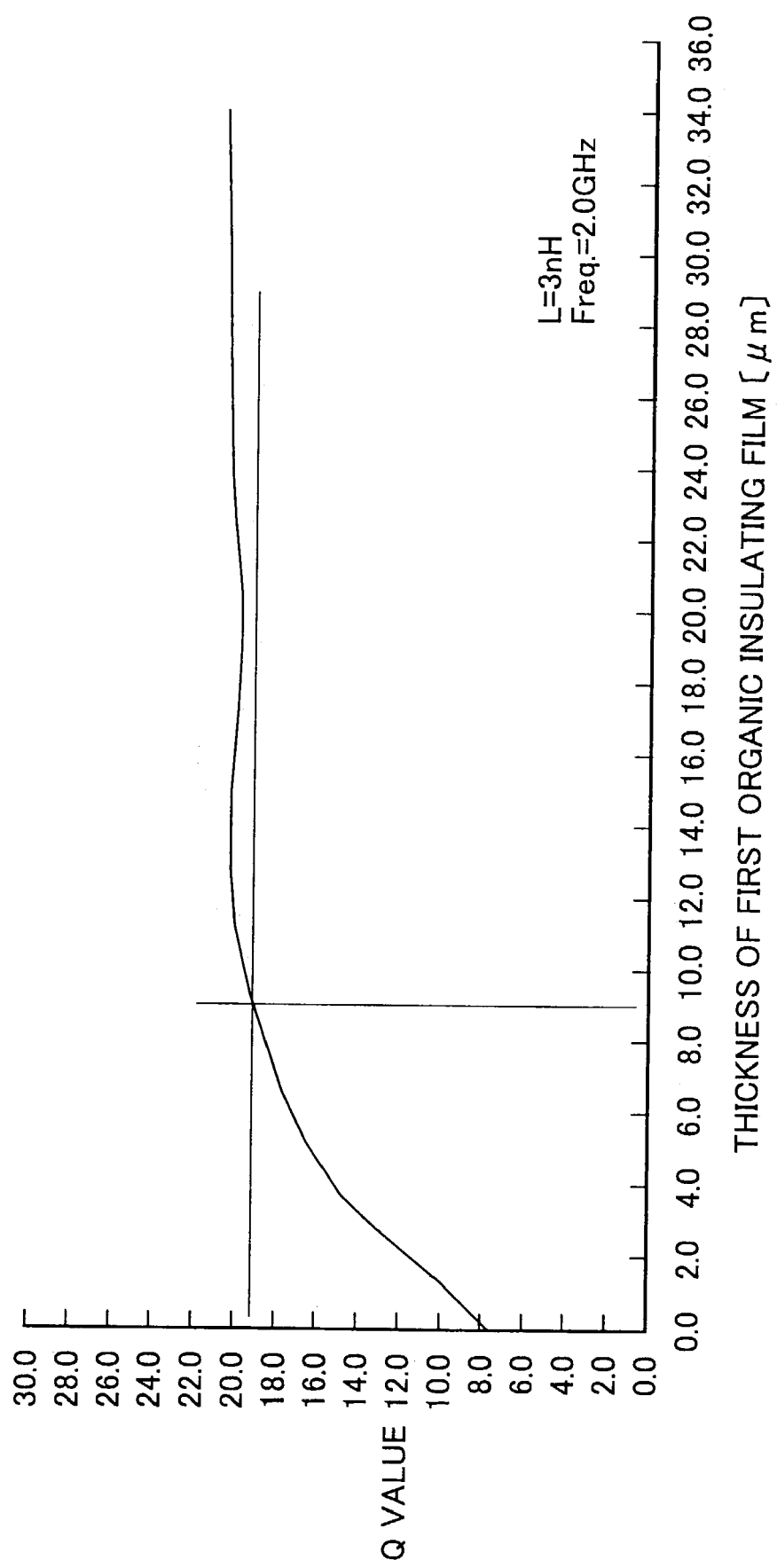
FIG. 17 is a graph that illustrates the relationship between the thickness of the first organic insulating film and the Q value in the electronic device according to the seventh embodiment of the present invention.

FIG. 17 indicates the relationship between the thickness of the first organic insulating film 44 (the total thickness of the first and second polyimide layers 42 and 43) and the Q value. The characteristics indicated in this chart are the results from an experiment performed with the inductance of the spiral inductor 20 set to 3 nH and the frequency to 2.0 GHz.

According to FIG. 17, the Q value gradually increases when the thickness of the first organic insulating film 44 is within the range of 0.0 µm to 9.0 µm, and stabilizes at a value of approximately 20.0 when the thickness of the first organic insulating film 44 goes above 9.0 µm. In other words, a high Q value of the spiral inductor can be maintained once the thickness of the first organic insulating film 44 is above 9.0 µm.

Figure 18:
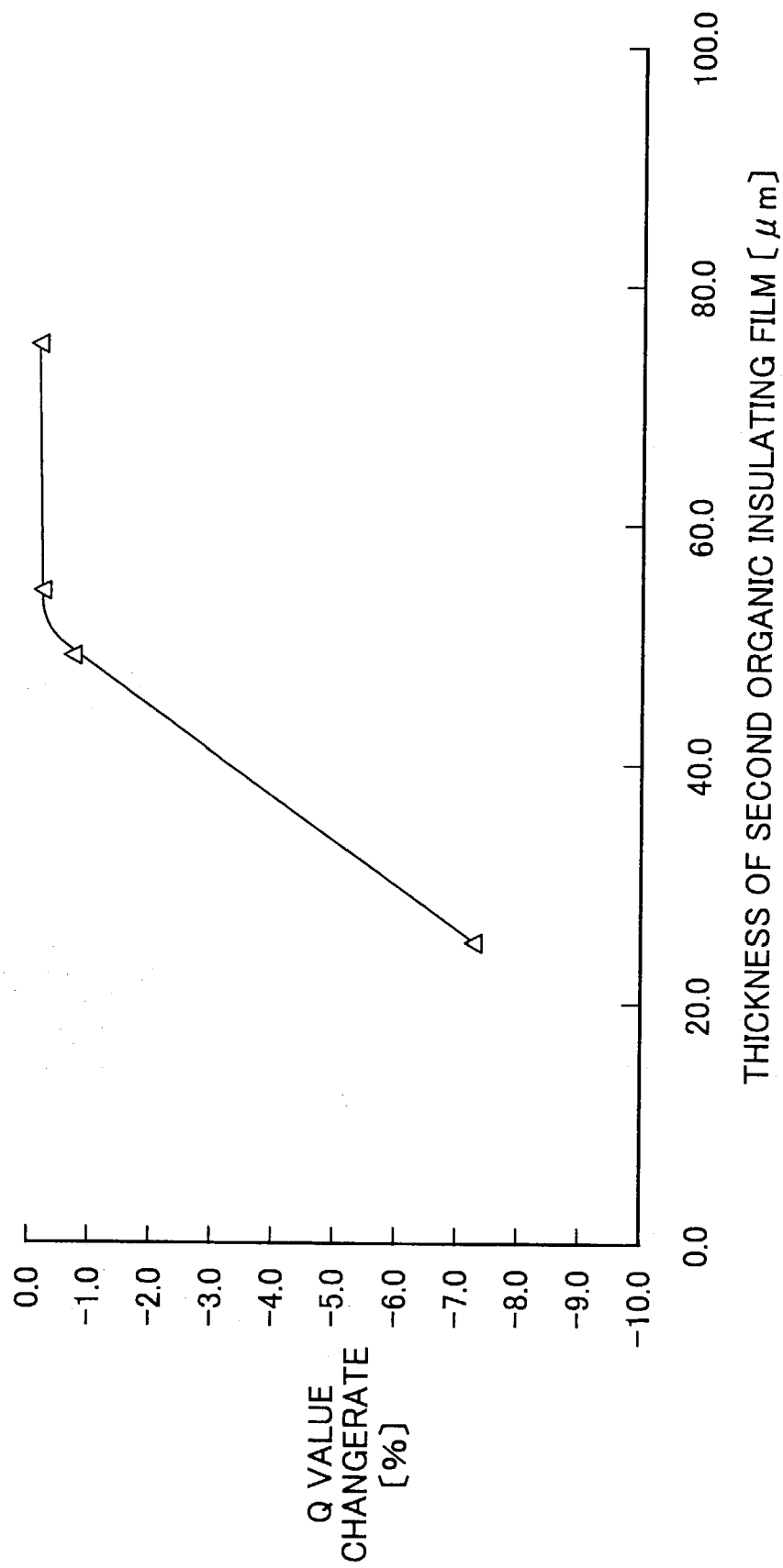
FIG. 18 is a graph that illustrates the relationship between the thickness of the second organic insulating film and the change rate of the Q value in the electronic device according to the seventh embodiment of the present invention.

FIG. 18 indicates the relationship between the thickness of the second organic insulating film and the Q value. The characteristics indicated in this chart are also the results from an experiment performed with the inductance of the spiral inductor 20 set to 3 nH and the frequency to 2.0 GHz.

According to FIG. 18, the Q value change rate gradually increases when the thickness of the second organic insulating film 45 is within the range of 24.0 µm to 55.0 µm, and stabilizes at a value of approximately 0.0 when the thickness of the second organic insulating film 45 goes above 55.0 µm. In other words, a high Q value of the spiral inductor can be maintained once the thickness of the second organic insulating film 45 is above 55.0 µm.

Thus, by setting the thickness of the first organic insulating film 44 to no less than 9.0 µm, a reasonable distance between the spiral inductor 20 and the substrate 11 (the circuit formation surface) can be maintained. Similarly, by setting the thickness of the second organic insulating film 45 to no less than 55.0 µm, a reasonable distance can be maintained between the outside and the spiral inductor 20.

According to this embodiment, parasitic capacitance and parasitic resistance can be prevented from being generated in between the substrate 11 and the spiral inductor 20, and parasitic capacitance and parasitic resistance can also be prevented from being generated in between the exterior devices and apparatuses of the semiconductor device 10G and the spiral inductor, thereby increasing the Q value of the spiral inductor. Thus, a microwave monolithic integrated circuit (MMIC) having a high Q value can be realized in the semiconductor device 10G.

Further, in this embodiment, the first organic insulating film 44 is made of organic insulating material having polyimide as its main component. The insulating material with polyimide as its main component has a high inductance value and a low dielectric constant (relative dielectric constant), therefore being capable of preventing the degradation of the Q value of the spiral inductor 20. Also, the material of the first organic insulating film 44 may be an organic insulating material with epoxy as its chief component rather than polyimide. The dielectric constant of epoxy is not as low as that of polyimide; however, its excellent mechanical and electrical stability can compensate for this weakness.

The second organic insulating film 45 is made of epoxy or organic insulating material with epoxy as its main component (both referred to as epoxy hereinafter). By providing such a composition, the spiral inductor and the substrate can be protected by the epoxy, which has excellent mechanical strength and can improve the reliability of the semiconductor device 10G. Also, since epoxy has a high inductance value, it is capable of preventing the degradation of the Q value of the spiral inductor.

In the following, a description of the structure of the via 48 is given. The via 48 electrically connects the spiral inductor 20 formed on the first organic insulating film 44 and the electrode 46 formed on the substrate 11 through the inorganic insulating layer 41 and the first organic insulating film 44.

In other words, the via 48 functions as an inter-layer wiring that connects the spiral inductor 20 to the electrode 46 through each of the insulating layers 41–44. Thus, openings 41A, 42A, and 43A are formed at the inorganic insulating layer 41 and the first organic insulating film 44 (the first polyimide layer 42 and the second polyimide layer 43), respectively, in order to create the via 48. The following description concerns the size of each of the openings 41A, 42A, and 43A in relation to each other.

First, comparing the diameter of the opening 42A of the first polyimide layer 42 (indicated by arrow $L_{42}$ in FIG. 16) and the diameter of the opening 43A of the second polyimide layer 43 (indicated by arrow $L_{43}$ in FIG. 16), the diameter $L_{42}$ of the opening 42A is larger than the diameter $L_{43}$ of the opening 43A ($L_{42}>L_{43}$). Namely, the diameters $L_{42}$ and $L_{43}$ of the openings 42A and 43A formed at each of the polyimide layers 42 and 43, respectively, are arranged so that the layer situated in a higher position from the substrate 11 has a smaller opening.

On the other hand, the second polyimide layer 43, which is the uppermost layer (i.e. the uppermost layer among the multi-layered polyimide layers forming the first organic insulating film 44), is arranged to cover the tips of the inorganic insulating layer 41 and the first polyimide layer 42 situated below. In other words, the second polyimide layer 43 has a covering portion 43B that covers the inorganic insulating layer 41 and the first polyimide layer 42 and extends on to touch the upper surface of the electrode 46. The opening 43A formed by the above covering portion 43B becomes the so-called via hole of via 48.

Next, a comparison is made between the diameter of the hole formed at the first organic insulating film 44 and the diameter of the opening 41A formed at the inorganic insulating layer 41 (indicated by arrow $L_{41}$ in FIG. 16)

The diameter of the hole formed at the first organic insulating film 44 corresponds to the diameter of the smallest opening of the polyimide layers when the first organic insulating film 44 is made of a plurality of polyimide layers (in this embodiment, the diameter $L_{43}$ of the opening 43A corresponds to the above diameter of the hole formed at the first organic insulating film 44).

As indicated in FIG. 16, in the present embodiment, the diameter $L_{43}$ of the hole formed at the first organic insulating film 44 is smaller than the diameter $L_{41}$ of the opening 41A ($L_{43}<L_{41}$). Also, as previously described, the covering portion 43B of the second polyimide layer 43 covers the inorganic insulating layer 41 where the opening 41A is formed.

By implementing the above described structure, the step-shaped surface formed by the plurality of polyimide layers 42 and 43 can be filled in and smoothened out by the uppermost polyimide layer (the second polyimide layer 43). Similarly, the step shaped surface formed by the inorganic insulating layer 41 and the first organic insulating film 44 can be evened out by the covering portion 43B.

In the above embodiment, the surface of the hole in which a conductive metal film that is to be the via 48 (inter-layer wiring) is formed, namely, the surface of the covering portion 43B, is a smooth sloped surface; thus, even when the via 48 is formed in the covering portion 43B, stress within the via 48 can be prevented from remaining therein (in the step-shaped structure, stress is generated at the corners formed on the surface). In turn, defects such as cracks in the via 48 can be avoided and the reliability of the semiconductor device 10G can be improved. Also, since the surface of the covering portion 43B is a smooth tapered surface, the metal film that is to be the via 48 can be accurately formed in the hole.

Additionally, in this embodiment, the diameter $L_{43}$ of the so-called via hole of the via 48 (the opening formed in the area where the via 48 and the electrode 46 are electrically connected, which corresponds to opening 43A in this embodiment) is set to 20–50 µm. In this way, the semiconductor device 10G can be miniaturized while preventing the impedance of the via 48 from rising.

Figure 19:
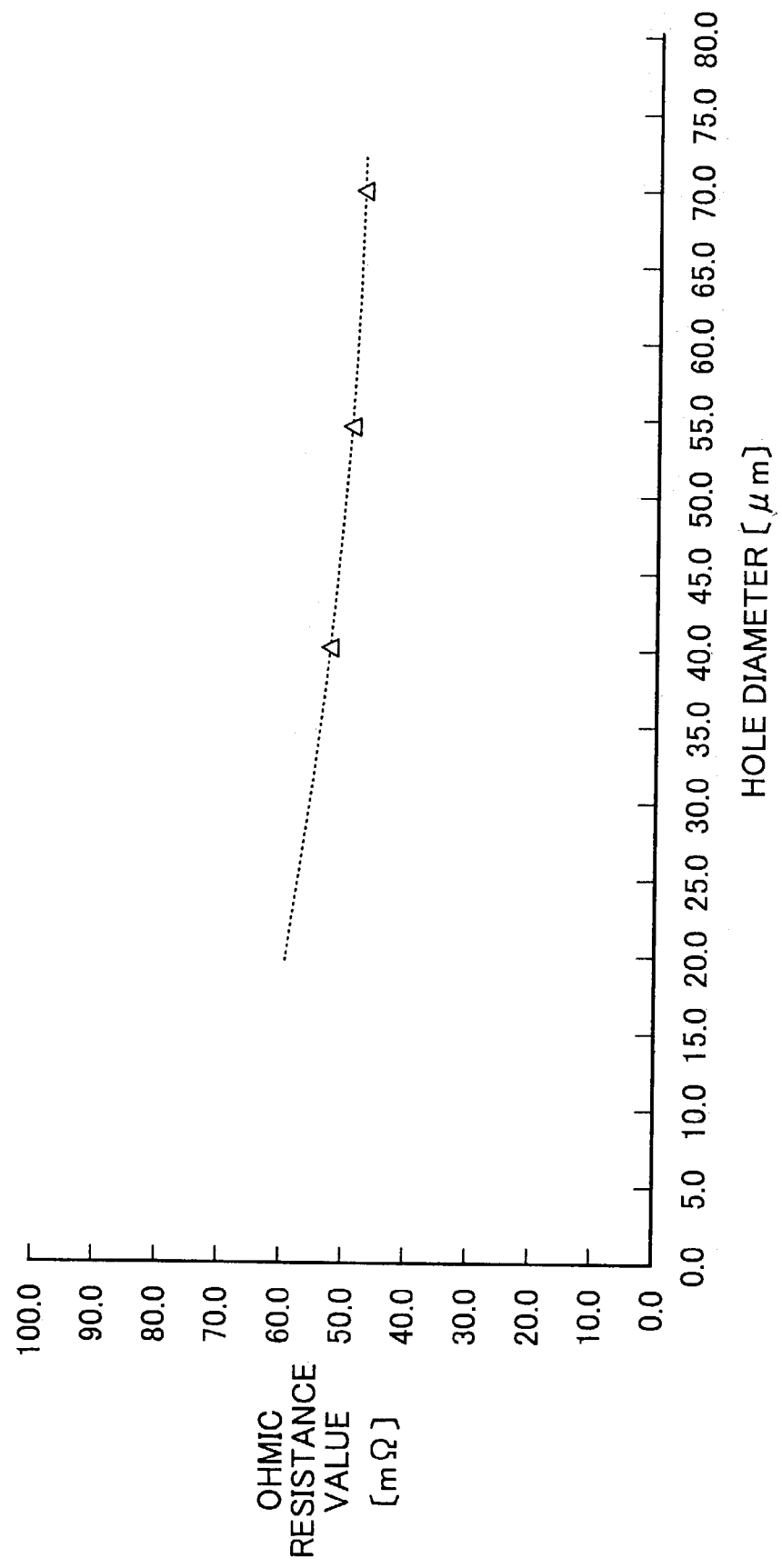
FIG. 19 is a graph that illustrates the relationship between the hole diameter of the via and the ohmic resistance value in the electronic device according to the seventh embodiment of the present invention.

FIG. 19 shows the relationship between the ohmic resistance value (impedance value) of the connecting location of the via 48 and the electrode 46, and the diameter of the via hole. According to the above drawing, the ohmic resistance value is lowered with an increase in the diameter of the via hole. However, when the diameter of the via hole opening goes below 20.0 µm the ohmic resistance goes beyond 60.0 m, and is therefore unsuitable for the present invention.

On the other hand when the above diameter exceeds 50 µm, the area of the electrode 46 becomes too large, thereby hindering the miniaturization of the semiconductor device 10G. Thus, by setting the diameter $L_{43}$ of the diameter of the via hole to 20–50 µm, the semiconductor device 10G can be miniaturized and the impedance of the via 48 can be restrained from rising.

Also, in this embodiment, the post 21 is used for connecting the external electrode 49 and the spiral inductor 20. Thus, the thickness W1 of the second organic insulating film 45 can be precisely determined by the post 21 upon the fabrication of the semiconductor device 10G. This is due to the fact that the second organic insulating film 45 is prevented from having a thickness that is greater than the height of the post 21.

Also, in the description of the above embodiment, the first organic insulating film 44 has a multi-layered structure; however, the above first organic insulating film 44 may also have a single-layer structure. Further, the spiral inductor is not limited to having a spiral-shaped structure but may also take other forms such as a rectangular-shaped structure.

In the following, a description of an eighth embodiment of the present invention is given.

Figure 20:
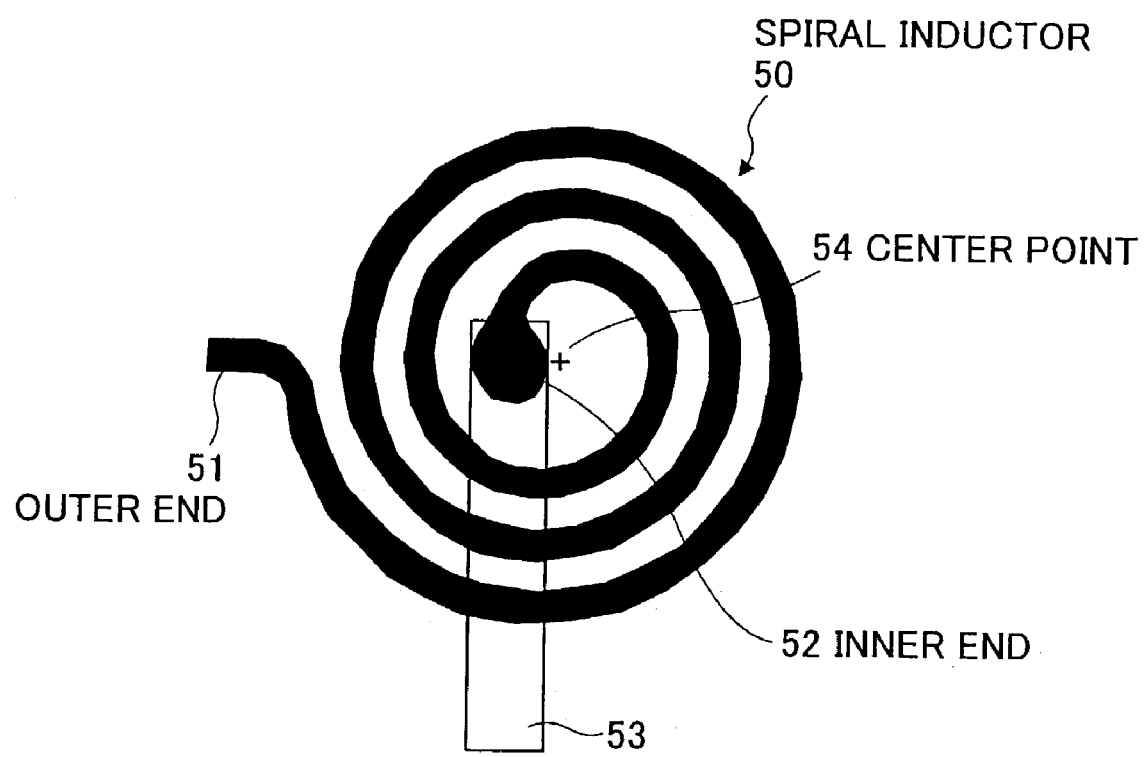
FIG. 20 is an enlarged diagram of the spiral inductor implemented in the electronic device according to an eighth embodiment of the present invention.

FIG. 20 shows an enlarged view of a spiral inductor 50 implemented on the semiconductor device according to the eighth embodiment of the present invention. In this embodiment the inner end 52 of the spiral inductor 50 is shifted from the spiral inductor center point 54 and an extended wiring 53 that extends from the above inner end 52 of the spiral inductor avoiding the center point 54 is formed. In other words, in the area around the center point 54 of the spiral inductor 50, an unpatterned portion that does not accommodate the re-wiring layer 16 comprising the spiral inductor 50 is provided.

The above embodiment can realize the miniaturization of the spiral inductor 50 as well as a high Q value in the spiral inductor 50. Why this can be achieved is explained in the following paragraphs with reference to FIGS. 21A, 21B, 21C, and 22.

Figure 21A:
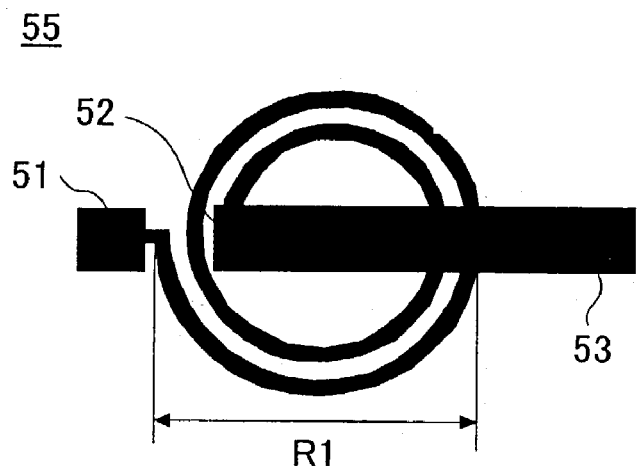
FIGS. 21A, 21B, and 21C are diagrams for illustrating the difference between the spiral inductor of the conventional art and the characteristics of the spiral inductor that is implemented in the electronic device according to the eighth embodiment of the present invention; and, FIG. 22 is a graph illustrating the difference between the characteristics of the spiral inductor of the conventional art and the spiral inductor that is implemented in the electronic device according to the eighth embodiment of the present invention.

The spiral inductor 55 illustrated in FIG. 21A has an inner end that is shifted from the center point of the spiral inductor 55 as in the spiral inductor 50 according to the present embodiment. However, the extended wiring 53 passes through the center point of the spiral inductor 55 rather than avoiding this area.

Figure 21B:
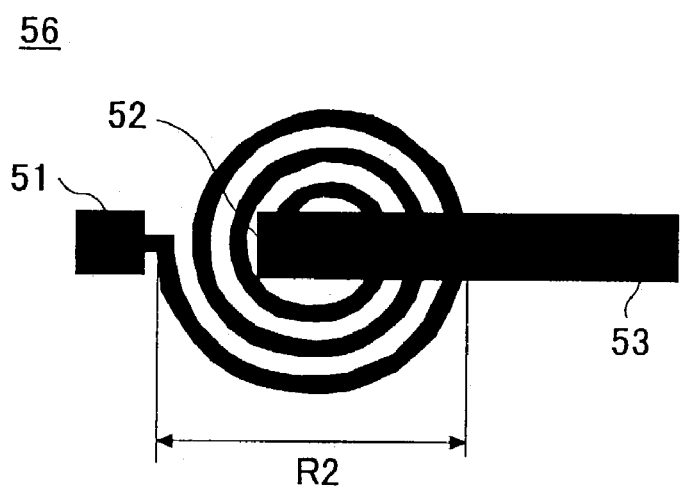

The spiral inductor 56 illustrated in FIG. 21B is arranged so as to miniaturize the structure of spiral inductor 55 shown in FIG. 21A. Specifically, the diameter R2 of the spiral inductor 56 of FIG. 21B is arranged to be smaller than the diameter R1 of the spiral inductor 55 of FIG. 21A (R2<R1). However, the extended wiring 53 of the spiral inductor 56 also passes through the center point of the spiral inductor 56.

Figure 21C:
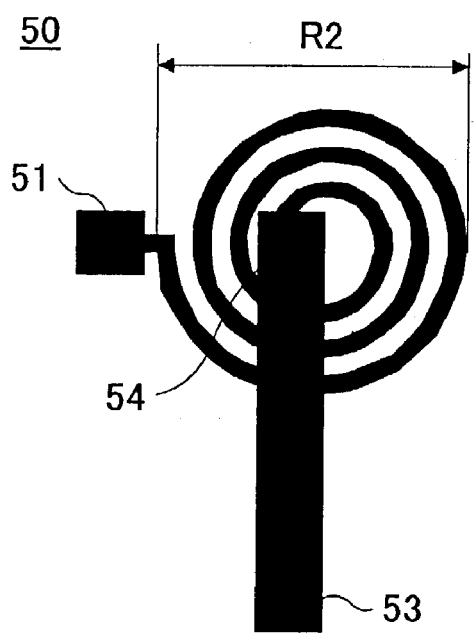

FIG. 21C shows the spiral inductor 50 of FIG. 20, which is in accordance with the eighth embodiment of the present invention. The diameter of this spiral inductor 50 is equivalent to the diameter R2 of the spiral inductor 56 shown in FIG. 21B, which is a miniaturized version of the spiral inductor 55.

Figure 22:
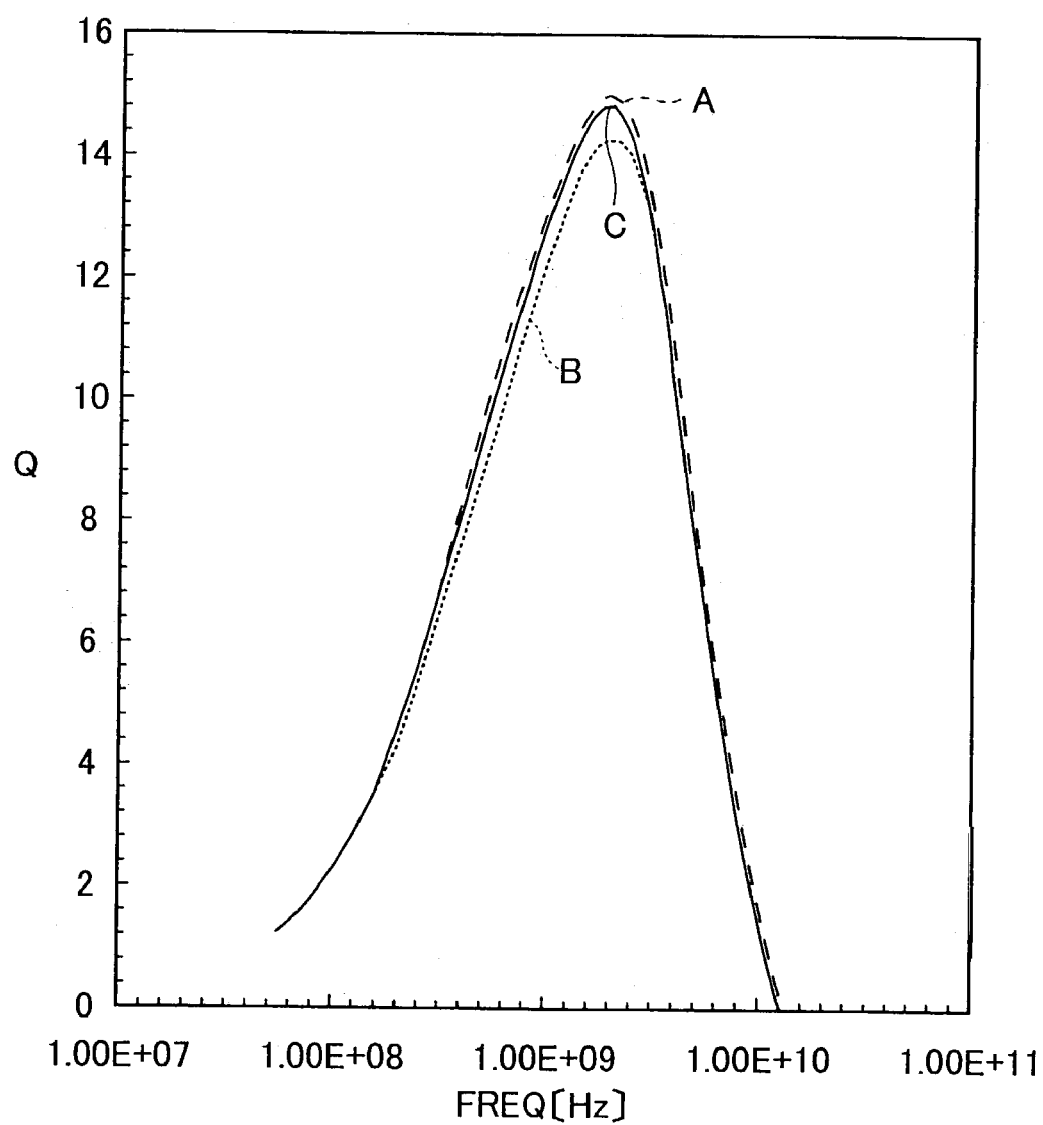

FIG. 22 indicates the Q value characteristics of each of the above spiral inductors 55, 56, and 50. The values indicated by line A in the above graph correspond to the characteristics of the spiral inductor 55 (FIG. 21A), the values indicated by line B correspond to the characteristics of the spiral inductor 56 (FIG. 21B), and the values indicated by line C correspond to the characteristics of the spiral inductor 50 (FIG. 21C), which is in accordance with the embodiment of the present invention.

From FIG. 22, it can be discerned that the Q value characteristics of the spiral inductor 55 shown in FIG. 21A are superior to those of the spiral inductors 50 and 56. However, as previously mentioned, the diameter R1 is large, thereby enlarging the semiconductor device that accommodates the above spiral inductor 55.

In contrast, the spiral inductor 56 shown in FIG. 21B has a small diameter R2 and therefore realizes the miniaturization of the semiconductor device into which the above spiral inductor 56 is accommodated. However, the Q value characteristics of this spiral inductor 56 are inferior to those of the other spiral inductors 50 and 55.

On the other hand, the spiral inductor 50 according to the above embodiment of the present invention has a small diameter R2 so that the miniaturization of the semiconductor device can be realized, and at the same time, has Q value characteristics that are practically identical to those of the spiral inductor 55. Thus, in this embodiment, the miniaturization of the semiconductor device and the maintenance of high Q value characteristics can both be realized.

The present invention as described above has various advantages, which are discussed in the following paragraphs.

According to the present invention, a plurality of functions can be provided in the electronic device, thereby enabling the miniaturization of the electronic apparatus as well as the reduction in the number of components.

Also, since the electronic circuit formed by the internal wiring may be an inductor, a higher degree of flexibility in setting the inductance value is provided, compared to a structure where the inductor is mounted directly onto the substrate.

Additionally, since the internal wiring may be a spiral inductor in the present invention, a high inductance value can be realized in a very small area. In addition, since the spiral inductor is structured by the internal wiring formed into a pattern inside the insulating layer, it can be easily fabricated at a low cost.

Further, by forming multiple layers of the spiral inductor in the electronic device, an even higher inductance value can be realized Also, by setting the connecting position of the electronic circuit formed by the internal wiring and the electronic circuit formed on the substrate at the inner end of the internal wiring, the characteristics degradation caused by the extension line in the above connecting position of the electronic circuits can be minimized, and the influence from oscillation may also be controlled.

Alternatively, by forming an antenna with the internal wiring, a receiver may be formed with just one chip, thereby realizing a highly reliable miniature transmitter, receiver, or transmitter/receiver device with little characteristics degradation due to such factors as the wiring.

Also, by forming an inductor and an antenna with the internal wiring, an even smaller multi-functional electronic device can be realized.

Further, by arranging the inductor and the antenna into a layered structure and positioning the antenna further away from the circuit formation surface with respect to the inductor, the electronic device can be made even smaller. Also, by placing the antenna at a position further away from the circuit formation surface compared to the inductor, namely, by placing the antenna close to the surface or at the surface of the insulating layer, the transmission and reception process of the antenna can be protected from the influence of the inductor. As a result, high transmission and reception characteristics can be achieved.

Also, a highly reliable electronic device can be realized by placing the antenna on the opposite side of the circuit formation surface.

Further, by electrically separating (isolation) the electronic circuit formed by said internal wiring and the electronic circuit formed on said substrate with the shield layer, both circuits can be prevented from affecting each other. This results in an electronic device with excellent reliability.

Further, by electrically separating the substrate and the electronic circuit formed by the internal wiring with the isolation layer, the degradation of the Q value of the above electronic circuit caused by the influence from the substrate can be prevented and the reliability of the electronic device can be increased.

Additionally, by setting the thickness of the first insulating film to no less than 9 µm, the parasitic capacitance and the parasitic resistance can be prevented from being generated in between the substrate and the inductor. Also, by setting the thickness of the second insulating film to no less than 55 µm, the parasitic capacitance and the parasitic resistance can be prevented from being generated in between the exterior devices and apparatuses and the inductor. The reduction in the parasitic capacitance and the parasitic resistance in turn enables the increase of the Q value of the inductor.

Also, a microwave monolithic integrated circuit (MMIC) having a high Q value can be realized in the present invention.

Further, by using insulating material with polyimide as its main component, which has a high inductance value and a low dielectric constant (relative dielectric constant) or by using insulating material with epoxy as its main component, which provides excellent isolation characteristics, as the first insulating film, the degradation of the Q value of the inductor can be prevented.

Also, by forming the second insulating layer of the electronic device with epoxy or organic insulating material with epoxy as a main component, the inductor and the substrate can be protected by epoxy or the insulating material with epoxy as its main component since both have excellent mechanical strength, and the reliability of the electronic device can be enhanced. Also, epoxy or the insulating material with epoxy as its main component both have high isolation characteristics, thereby preventing the degradation of the Q value of the inductor.

In forming the inter-layer wiring, by arranging the diameter of each hole formed on each insulating layer so that the insulating layer positioned higher from the substrate has the smaller diameter and at least the uppermost insulating layer covers the inorganic insulating layer, the uppermost insulating layer can fill in the step-shaped surface formed by the plurality of insulating layers forming the first insulating film and the surface of the hole onto which the inter-layer wiring is implemented can be made smooth. Further, the reliability in the inter-layer wiring formation area can be improved since stress will not remain in the inter-layer wiring upon the formation of the inter-layer wiring onto the surface of the hole. Also, since the inner wall of the hole is a tapered smooth surface the metal film that is to be the inter-layer wiring can be accurately implemented onto the inner wall of the hole forming the inter-layer wiring.

Also, by arranging the diameter of the hole for implementing the inter-layer wiring formed at the first insulating film to be smaller than the diameter of the above hole formed at the inorganic insulating layer, and by arranging the first insulating film to cover said inorganic insulating layer, the stepped surface formed by the inorganic insulating layer and the first insulating film can be filled in by the first insulating film so that the surface of the hole accommodating the inter-layer wiring is made smooth. As a result, stress will not remain in the inter-layer wiring upon the formation of the inter-layer wiring onto the surface of the hole, and the reliability in the inter-layer wiring formation area can be improved.

Further, by restricting the diameter of the hole into which the inter-layer wiring is formed, the miniaturization of the electronic device can be realized while the rise of the impedance in the inter-layer wiring is also controlled.

Finally, by implementing a wiring post for connecting the wiring to an external connection terminal, the thickness of the second insulating film will not exceed the height of the wiring post, thus enabling the precise determination of the thickness of the second insulating film.

This patent application is based on and claims the benefit of the earlier filing date of Japanese patent application No. 2001-381325 filed Dec. 14, 2001, and Japanese patent application No. 2002-307429 filed Oct. 22, 2002, the entire contents of which are hereby incorporated by reference.

What is claimed is:

1. An electronic device having an electronic circuit and an external connection terminal that is connected to said electronic circuit, said electronic device comprising:
   a substrate having a circuit formation surface on which one portion of said electronic circuit corresponding to a high frequency active circuit is formed;
   an isolating layer formed on said substrate;
   a first insulating layer having a thickness of at least 9 μm formed on said circuit formation surface and said isolating layer;
   internal wiring that comprises a first wiring portion for connecting said electronic circuit to said external connection terminal and a second wiring portion formed into a pattern in said first insulating layer and on said first insulating layer at a position where said isolating layer is formed; and
   a second insulating layer formed on said internal wiring.

2. The electronic device as claimed in claim 1, wherein said electronic circuit formed by said internal wiring is a spiral inductor.

3. The electronic device as claimed in claim 2, comprising a plurality of said spiral inductors formed into a multi-layered structure.

4. The electronic device as claimed in claim 1, further comprising a connecting position of said electronic circuit formed by said internal wiring to said electronic circuit formed on the circuit formation surface of said substrate, said connecting point being situated at the inner end of said internal wiring.

5. The electronic device as claimed in claim 1, wherein the electronic circuit formed by said internal wiring is an antenna.

6. The electronic device as claimed in claim 1, wherein:
   an inductor and an antenna is formed as said electronic circuit formed by said internal wiring; and
   said inductor and said antenna form a layered structure, the antenna being distanced further away from said circuit formation surface compared to the inductor.

7. The electronic device as claimed in claim 1, further comprising a shield layer formed in between the electronic circuit formed by said internal wiring and the electronic circuit formed on said substrate.

8. The electronic device as claimed in claim 7, wherein said shield layer has a mesh structure.

9. The electronic device as claimed in claim 1, further comprising, on the substrate, an isolating layer for electrically separating said substrate from the electronic circuit formed by said internal wiring.

10. The electronic device as claimed in claim 9, wherein said isolating layer comprises an insulating material that is filled into a microscopic trench formed on said substrate.

* * * * *